(12) United States Patent
Inoue et al.

(10) Patent No.: US 7,078,989 B2
(45) Date of Patent: Jul. 18, 2006

(54) MULTI-MODE SURFACE ACOUSTIC WAVE FILTER DEVICE AND DUPLEXER

(75) Inventors: Shogo Inoue, Kawasaki (JP); Jun Tsutsumi, Kawasaki (JP); Takashi Matsuda, Kawasaki (JP); Masanori Ueda, Yokohama (JP)

(73) Assignees: Fujitsu Media Devices Limited, Yokohama (JP); Fujitsu Limited, Kawasaki (JP)

( * ) Notice: Subject to any disclaimer, the term of this patent is extended or adjusted under 35 U.S.C. 154(b) by 0 days.

(21) Appl. No.: 10/682,917

(22) Filed: Oct. 14, 2003

(65) Prior Publication Data

US 2004/0075511 A1     Apr. 22, 2004

(30) Foreign Application Priority Data

Oct. 18, 2002 (JP) ............................. 2002-304035
Apr. 23, 2003 (JP) ............................. 2003-119132

(51) Int. Cl.
*H03H 9/64* (2006.01)
*H03H 9/72* (2006.01)

(52) U.S. Cl. ..................................... 333/195; 333/133
(58) Field of Classification Search ........ 333/193–196, 333/133; 310/313 B, 313 D
See application file for complete search history.

(56) References Cited

U.S. PATENT DOCUMENTS

| | | | | |
|---|---|---|---|---|
| 5,392,013 A | * | 2/1995 | Yamamoto et al. | 333/195 |
| 5,396,199 A | * | 3/1995 | Tera et al. | 333/150 |
| 5,909,158 A | * | 6/1999 | Hiramoto | 333/195 |
| 5,929,724 A | * | 7/1999 | D'Souza | 333/193 |
| 6,163,236 A | * | 12/2000 | Thomas | 333/195 |
| 6,329,888 B1 | * | 12/2001 | Hirota | 333/193 |
| 6,339,365 B1 | * | 1/2002 | Kawase et al. | 333/193 |
| 6,388,545 B1 | * | 5/2002 | Kawachi et al. | 333/193 |
| 6,424,240 B1 | * | 7/2002 | Yoshikawa | 333/195 |
| 6,597,262 B1 | * | 7/2003 | Takamine | 333/193 |
| 6,667,673 B1 | * | 12/2003 | Strauss | 333/195 |
| 6,710,676 B1 | * | 3/2004 | Yata et al. | 333/133 |
| 6,720,842 B1 | * | 4/2004 | Sawada | 333/133 |
| 6,828,879 B1 | * | 12/2004 | Tanaka et al. | 333/195 |

FOREIGN PATENT DOCUMENTS

| | | | | |
|---|---|---|---|---|
| JP | 5-55871 | * | 3/1993 | ................. 333/193 |
| JP | 7-283689 | | 10/1995 | |
| JP | 8-181566 | * | 7/1996 | |
| JP | 8-242140 | | 9/1996 | |
| JP | 8-250969 | * | 9/1996 | |
| JP | 9-130203 | | 5/1997 | |

(Continued)

OTHER PUBLICATIONS

"Wideband Low Loss Double Mode Saw Filters", Takao Morita et al., IEEE 1992 Ultrasonics Symposium, pp. 95-104.

*Primary Examiner*—Barbara Summons
(74) *Attorney, Agent, or Firm*—Arent Fox PLLC

(57) ABSTRACT

A multi-mode surface acoustic wave filter device includes: a piezoelectric substrate; at least one input IDT (interdigital transducer) and at least one output IDT that are formed on the piezoelectric substrate; reflectors that are formed on the piezoelectric substrate and arranged on the external sides of the input IDT and the output IDT; an input terminal that supplies input signals to the input IDT; and an output terminal that receives output signals from the output IDT. In this multi-mode surface acoustic wave filter, the input terminal and the output terminal extend in the same direction.

19 Claims, 31 Drawing Sheets

FOREIGN PATENT DOCUMENTS

| | | | |
|---|---|---|---|
| JP | 9-162676 | | 6/1997 |
| JP | 9-205342 | * | 8/1997 |
| JP | 9-232908 | | 9/1997 |
| JP | 10-070436 | | 3/1998 |
| JP | 10-284988 A | | 10/1998 |
| JP | 2000-201048 | * | 7/2000 |
| JP | 2002-135078 | | 5/2002 |
| JP | 2002-185284 | | 6/2002 |
| JP | 2002-300005 | | 10/2002 |
| JP | 2003-174350 | * | 6/2003 |

* cited by examiner

NO PARALLEL
CONNECTED

2 FILTERS
CONNECTED
IN PARALLEL

3 FILTERS CONNECTED
IN PARALLEL

MULTI-MODE SURFACE ACOUSTIC WAVE FILTER DEVICE AND DUPLEXER

BACKGROUND OF THE INVENTION

1. Field of the Invention

The present invention relates to multi-mode surface acoustic wave filter devices.

2. Description of the Related Art

Multi-mode surface acoustic wave (SAW) filters are well known as bandpass filters (see Proc. IEEE Ultrason. Symp., pp. 95–104, 1992, for example). A multi-mode SAW filter normally has input IDTs (interdigital transducers) and output IDTs arranged alternately, with SAW reflectors being provided at either end. The most common type of multi-mode SAW filter has one input IDT denoted by reference numeral 20 in FIG. 1, and two output IDTs denoted by reference numerals 30 and 40. A filter having this structure utilizes two resonance modes, and therefore, is often called a "double-mode SAW (DMS) filter". A grating reflector 50 is provided in the propagation direction of surface acoustic waves on the external side of the output IDT 30. Likewise, a grating reflector 60 is provided in the propagation direction of surface acoustic waves on the external side of the output IDT 40. The input IDT 20 and the output IDTs 30 and 40 are formed on a piezoelectric substrate 10.

Each of the input IDT 20 and the output IDTs 30 and 40 has a signal terminal (input/output) and a ground terminal that are connected to a signal bus bar and a ground bus bar, respectively. A "bus bar" is a conductive thin film that is connected to IDT electrode fingers and extends in the propagation direction of surface acoustic waves. More specifically, the input IDT 20 has an input terminal 25 and a ground terminal 26 that are connected to a signal bus bar 21 and a ground bus bar 22, respectively. The output IDT 30 has an output terminal 35 and a ground terminal 36 that are connected to a signal bus bar 31 and a ground bus bar 32, respectively. Likewise, the output IDT 40 has the output terminal 35 (shared with the output IDT 30) and the ground terminal 36 (also shared with the output IDT 30) that are connected to a signal bus bar 41 and a ground bus bar 42, respectively.

In each of the input IDT 20 and the output IDTs 30 and 40, the signal electrode fingers extend from the corresponding signal bus bar to the corresponding ground bus bar. More specifically, the signal electrode fingers 23 of the input IDT 20 extend from the signal bus bar 21 to the ground bus bar 22. The signal electrode fingers 33 of the output IDT 30 extend from the signal bus bar 31 to the ground bus bar 32. Likewise, the signal electrode fingers 43 of the output IDT 40 extend from the signal bus bar 41 to the ground bus bar 42. Also, in each of the input IDT 20 and the output IDTs 30 and 40, the ground electrode fingers extend from the corresponding ground bus bar to the corresponding signal bus bar. More specifically, the ground electrode fingers 24 of the input IDT 20 extend from the ground bus bar 22 to the signal bus bar 21. The ground electrode fingers 34 of the output IDT 30 extend from the ground bus bar 32 to the signal bus bar 31. Likewise, the ground electrode fingers 44 of the output IDT 40 extend from the ground bus bar 42 to the signal bus bar 41.

In a conventional DMS filter, the input terminal and the output terminal are normally arranged opposite to each other, so that signals can be prevented from reaching the output terminal from the input terminal through the air or the substrate. Accordingly, the ground electrode fingers 24 of the input IDT 20 extend in the opposite direction to (180-degree different from) the ground electrode fingers 34 and 44.

FIG. 2 shows typical bandpass characteristics of a conventional DMS filter. In the 2 GHz band, an insertion loss of approximately −4 dB and a stop-band suppression of −35 dB are obtained.

The bandpass characteristics of a conventional DMS filter, however, exhibit poor steepness in the rising region and the declining region, as shown in FIG. 2. Also, there is a lump-like shoulder formed in the stop-band area on the high-frequency side, as shown in FIG. 2. Furthermore, the insertion loss becomes too great. Filters to be employed in communication systems for mobile telephone communications or the likes are normally expected to have only a small loss and to be able to exhibit a very steep decline at both ends of the pass-band area. Most conventional DMS filters have failed to maintain those characteristics that are expected in filters for mobile communication systems.

SUMMARY OF THE INVENTION

It is therefore an object of the present invention to provide a multi-mode surface acoustic wave filter device in which the above disadvantage is eliminated.

A more specific object of the present invention is to provide a high-performance surface acoustic wave filter that exhibits a small loss and steep cut-off characteristics, and a duplexer using such a surface acoustic wave filter.

These objects of the present invention are achieved by a multi-mode surface acoustic wave filter device comprising: a piezoelectric substrate; at least one input IDT (interdigital transducer) and at least one output IDT that are formed on the piezoelectric substrate; reflectors that are formed on the piezoelectric substrate and arranged on external sides of the input IDT and the output IDT; an input terminal that supplies input signals to the input IDT; and an output terminal that receives output signals from the output IDT, the input terminal and the output terminal extending in an identical direction.

The above objects of the present invention are also achieved by a multi-mode surface acoustic wave filter device comprising: a piezoelectric substrate; at least one input IDT and at least one output IDT that are formed on the piezoelectric substrate; and reflectors that are formed on the piezoelectric substrate and arranged on external sides of the input IDT and the output IDT, ground electrode fingers of the input IDT and ground electrode fingers of the output IDT being connected to an identical ground bus bar.

The above objects of the present invention are achieved by a multi-mode surface acoustic wave filter device comprising at least two multi-mode surface acoustic wave filters that are electrically connected in parallel, each of the at least two multi-mode surface acoustic wave filters comprising: a piezoelectric substrate; at least one input IDT and at least one output IDT that are formed on the piezoelectric substrate; reflectors that are formed on the piezoelectric substrate and arranged on external sides of the input IDT and the output IDT; an input terminal that supplies input signals to the input IDT; and an output terminal that receives output signals from the output IDT, the input terminal and the output terminal extending in an identical direction.

The above objects of the present invention are achieved by a multi-mode surface acoustic wave filter device comprising at least two multi-mode surface acoustic wave filters that are electrically connected in parallel, each of the at least two multi-mode surface acoustic wave filters comprising: a piezoelectric substrate; at least one input IDT and at least one output IDT that are formed on the piezoelectric substrate; and reflectors that are formed on the piezoelectric substrate and arranged on external sides of the input IDT and the output IDT, ground electrode fingers of the input IDT and ground electrode fingers of the output IDT being connected to an identical ground bus bar.

The above objects of the present invention are achieved by a multi-mode surface acoustic wave filter device comprising at least two multi-mode surface acoustic wave filters that are electrically connected in parallel, each of the at least two multi-mode surface acoustic wave filters comprising: a piezoelectric substrate; at least one input IDT and at least one output IDT that are formed on the piezoelectric substrate; and reflectors that are formed on the piezoelectric substrate and arranged on external sides of the input IDT and the output IDT, the at least two multi-mode surface acoustic wave filters connected in parallel being arranged so as to have identical surface acoustic wave propagation paths, and a common reflector being interposed between the at least two multi-mode surface acoustic wave filters, the common reflector being shared between the at least two multi-mode surface acoustic wave filters.

The above objects of the present invention are also achieved by a multi-mode surface acoustic wave filter device comprising at least two multi-mode surface acoustic wave filters that are electrically connected in parallel, each of the at least two multi-mode surface acoustic wave filters comprising: a piezoelectric substrate; at least one input IDT and at least one output IDT that are formed on the piezoelectric substrate; and reflectors that are formed on the piezoelectric substrate and arranged on external sides of the input IDT and the output IDT, the at least two multi-mode surface acoustic wave filters connected in parallel being arranged so as to have identical surface acoustic wave propagation paths, and grating electrodes being interposed between each two neighboring multi-mode surface acoustic wave filters among the at least two multi-mode surface acoustic wave filters connected in parallel, the grating electrodes being arranged at an angle not perpendicular to propagation directions of surface acoustic waves.

The above objects of the present invention are also achieved by a multi-mode surface acoustic wave filter device comprising at least two multi-mode surface acoustic wave filters that are electrically connected in parallel, each of the at least two multi-mode surface acoustic wave filters comprising: a piezoelectric substrate; and at least one input IDT and at least one output IDT that are formed on the piezoelectric substrate, the at least two multi-mode surface acoustic wave filters connected in parallel being arranged so as to have identical surface acoustic wave propagation paths, and a triangular prism pattern being interposed between each two neighboring multi-mode surface acoustic wave filters among the at least two multi-mode surface acoustic wave filters connected in parallel.

The above objects of the present invention are also achieved by a multi-mode surface acoustic filter device comprising two or more multi-mode surface acoustic wave filters that are cascaded to each other, forming two or more sets of multi-mode surface acoustic wave filters, each of the two or more cascaded multi-mode surface acoustic wave filters comprising: a piezoelectric substrate; at least one input IDT and at least one output IDT that are formed on the piezoelectric substrate; reflectors that are formed on the piezoelectric substrate and arranged on external sides of the input IDT and the output IDT; an input terminal that supplies input signals to the input IDT; and an output terminal that receives output signals from the output IDT, the input terminal and the output terminal extending in an identical direction.

The above objects of the present invention are also achieved by a multi-mode surface acoustic wave filter device comprising: a piezoelectric substrate; at least one input IDT and at least one output IDT that are formed on the piezoelectric substrate; and reflectors that are formed on the piezoelectric substrate and arranged on external sides of the input IDT and the output IDT, ground electrode fingers of the input IDT extending in the same direction as ground electrode fingers of the output IDT.

The above objects of the present invention are also achieved by a multi-mode surface acoustic wave filter device comprising at least two multi-mode surface acoustic wave filters that are electrically connected in parallel, each of the at least two multi-mode surface acoustic wave filters comprising: a piezoelectric substrate; at least one input IDT and at least one output IDT that are formed on the piezoelectric substrate; and reflectors that are formed on the piezoelectric substrate and arranged on external sides of the input IDT and the output IDT, ground electrode fingers of the input IDT extending in the same direction as ground electrode fingers of the output IDT.

The above objects of the present invention are also achieved by a surface acoustic wave duplexer comprising a transmission filter and a reception filter, at least one of the transmission filter and the reception filter being a multi-mode surface acoustic wave filter that comprises: a piezoelectric substrate; at least one input IDT and at least one output IDT that are formed on the piezoelectric substrate; reflectors that are formed on the piezoelectric substrate and arranged on external sides of the input IDT and the output IDT; an input terminal that supplies input signals to the input IDT; and an output terminal that receives output signals from the output IDT, the input terminal and the output terminal extending in an identical direction.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a description of embodiments of the present invention, with reference to the accompanying drawings. It should be understood, however, that the present invention is not limited to the following embodiments.

Figure 1:
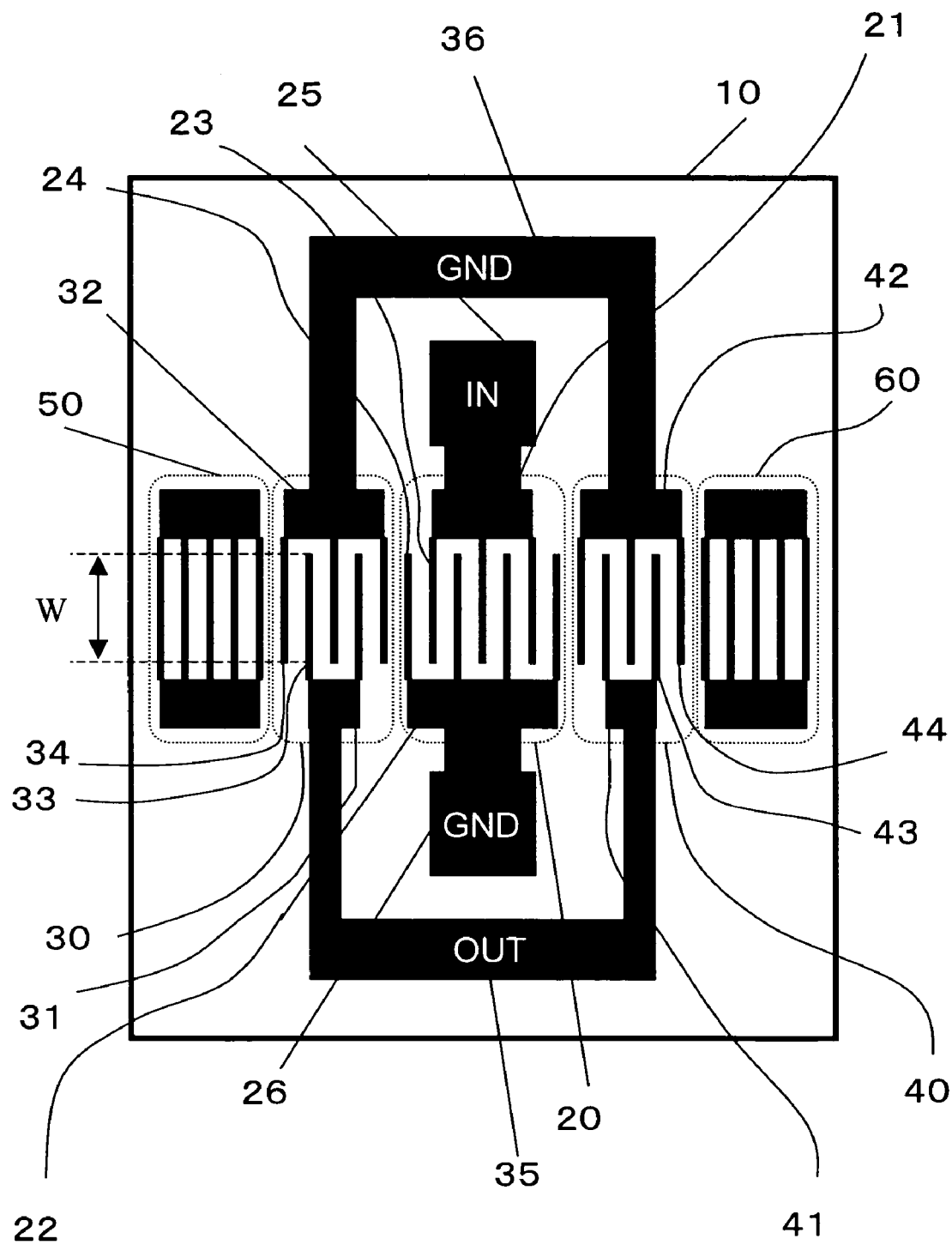
FIG. 1 illustrates a conventional double-mode SAW (DMS) filter.
Figure 2:
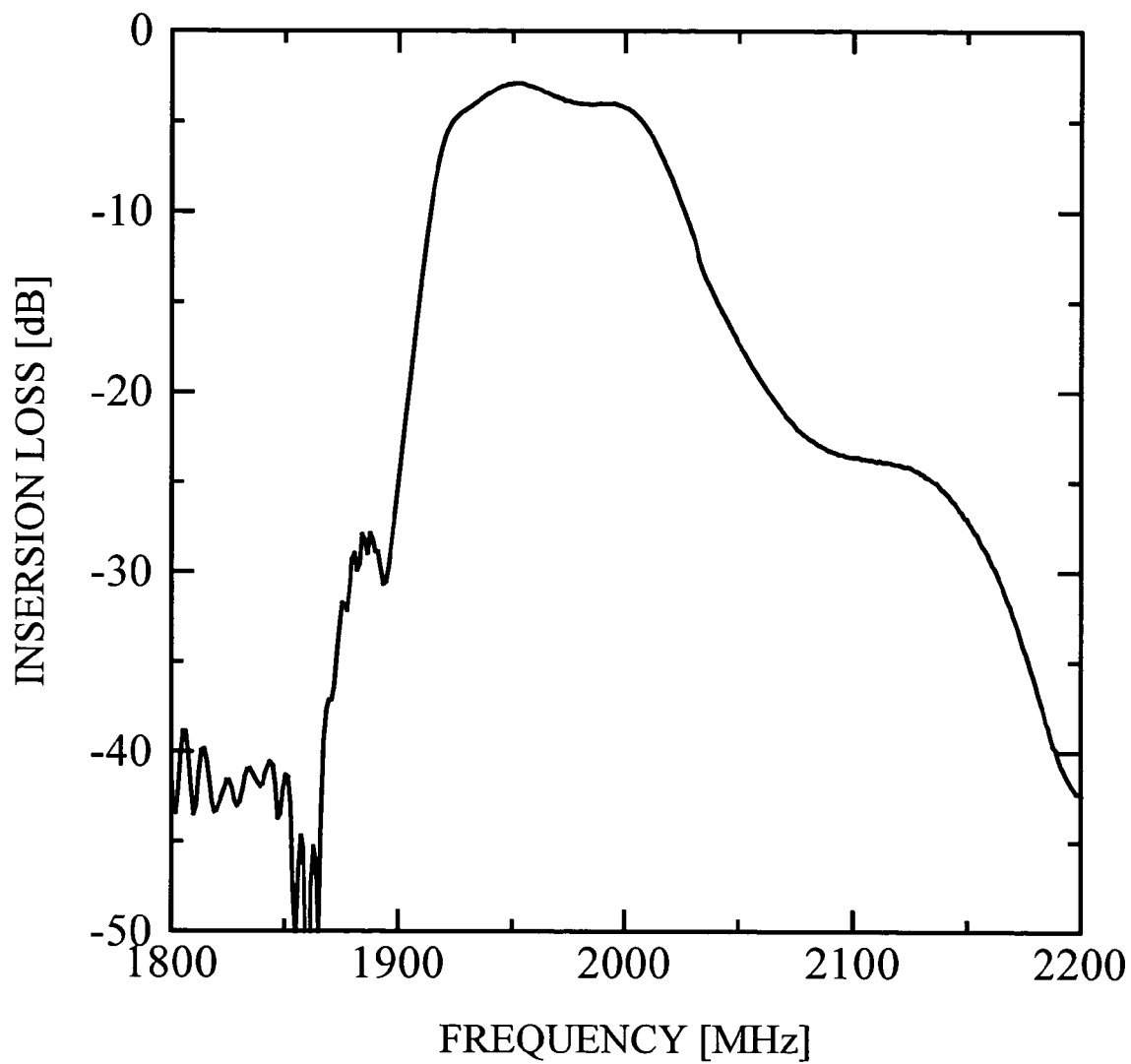
FIG. 2 shows the characteristics of the conventional DMS filter shown in FIG. 1.

As described in the Description of the Related Art, the conventional DMS filter shown in FIG. 1 has the input and output terminals arranged at a distance from each other, so that signals can be prevented from reaching the output terminal from the input terminal, and that the stop-band suppression can be increased. More specifically, the IDTs are arranged in such a manner that the input terminal and the output terminal are situated opposite to each other. To increase the stop-band suppression, it is natural to design a surface acoustic wave filter in such a manner that the input terminal and the output terminal are situated opposite to each other. On the contrary, the inventors of the present invention made an intensive study on a DMS filter in which an input terminal and an output terminal are located close to each other, i.e., a DMS filter in which an input terminal and an output terminal are adjacent to each other. To be more specific about the arrangement of the input terminal and the output terminal adjacent to each other, the input terminal for supplying input signals to the input IDT extends in the same direction as the output terminal that receives output signals from the output IDTs. In this case, the ground electrode fingers of the input IDT also extend in the same direction as the ground electrode fingers of the output IDTs. In the course of the study made on the present invention, the inventors manufactured DMS filters each having the above structure as experiments, and observed how the filter characteristics differed from those of conventional DMS filters. Each of the following embodiments and modifications has the above described arrangement and structure.

First Embodiment

Figure 3:
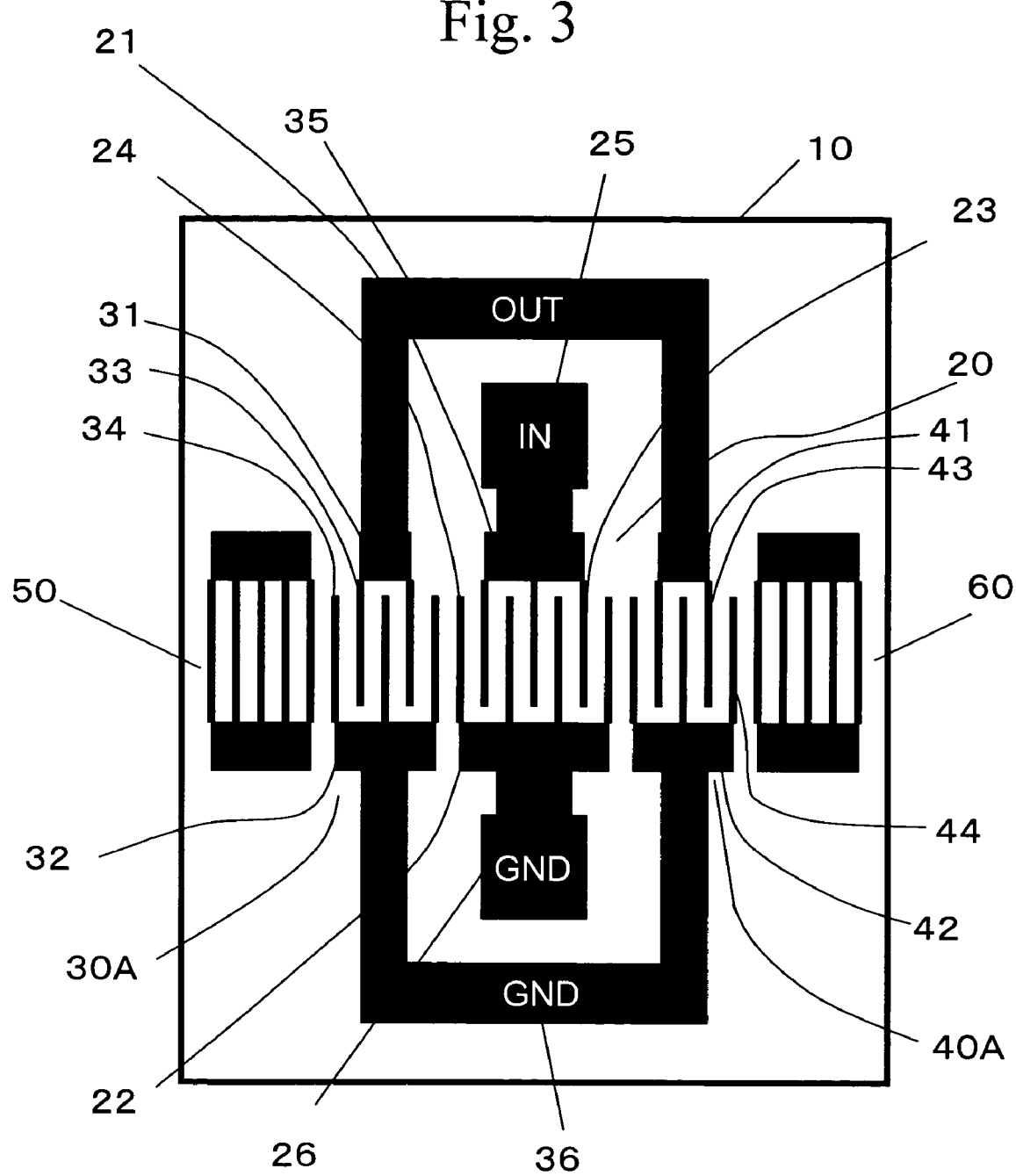
FIG. 3 illustrates a DMS filter device in accordance of a first embodiment of the present invention.

FIG. 3 is a plan view of a multi-mode SAW filter device in accordance with a first embodiment of the present invention. In FIG. 3, the same components as those in FIG. 1 are denoted by the same reference numerals as those in FIG. 1. This multi-mode SAW filter is a DMS filter that has an input IDT 20 and output IDTs 30A and 40A. Reflectors 50 and 60 that include grating electrodes formed on a piezoelectric substrate 10 are provided on the external sides of the output IDTs 30A and 40A. In this embodiment, the ground electrode fingers 24 of the input IDT 20 extend in the same direction as the ground electrode fingers 34 and 44 of the output IDTs 30A and 40A. In other words, the signal electrode fingers 23 of the input IDT 20 extend in the same direction as the signal electrode fingers 33 and 43 of the output IDTs 30A and 40A. With this arrangement, the input terminal 25 of the input IDT 20 and the output terminal 35 of the output IDTs 30A and 40A extend in the same direction and are adjacent to each other. Likewise, the ground terminal 26 of the input IDT 20 and the ground terminal 36 of the output IDTs 30A and 40A extend in the same direction and are adjacent to each other.

Figure 6:
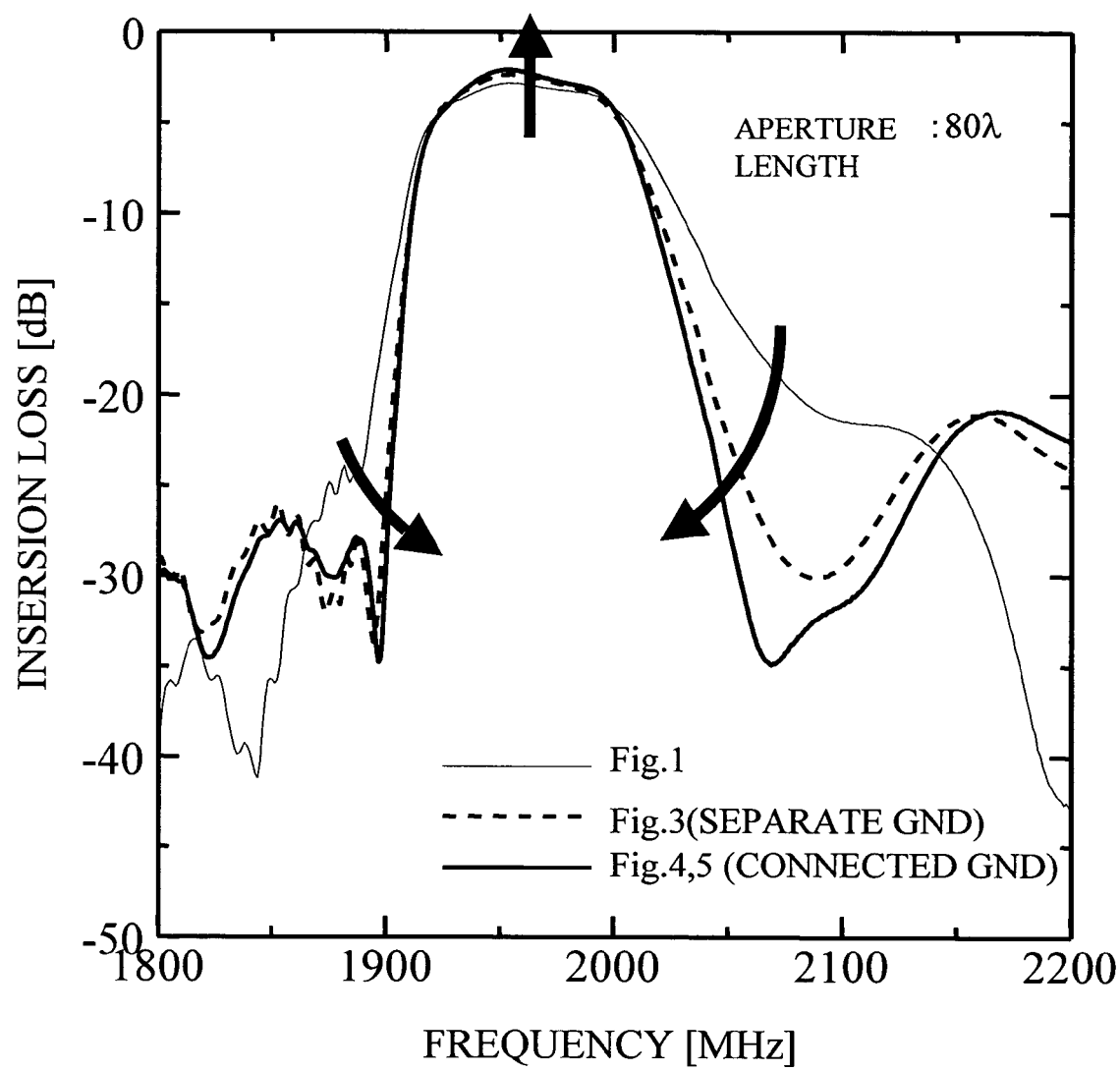
FIG. 6 shows the filter characteristics of the conventional DMS filter of FIG. 1 and the DMS filters of the first embodiment and the first and second modifications.

The DMS filter shown in FIG. 3 was produced, and the frequency characteristics in the 1.9 GHz band were measured. The measurement results are shown in FIG. 6. The abscissa axis in FIG. 6 indicates frequency (MHz), while the ordinate axis indicates insertion loss (dB). The aperture length W (the length of the overlapping part of the adjacent electrode fingers, as shown in FIG. 1) is 80 $\lambda$. Here, $\lambda$ represents the wavelength of surface acoustic waves. In FIG. 6, the broken line indicates the characteristics of the DMS filter shown in FIG. 3, and the thin solid line indicates the characteristics of the conventional DMS filter shown in FIG. 1. With the arrangement in which the input terminal 25 and the output terminal are adjacent to each other, the steepness in the rising region and the declining region of the filter characteristics greatly increased without impedance mismatching, compared with the conventional filter characteristics indicated by the thin solid line. Also, the insertion loss in the pass band decreased.

Figure 4:
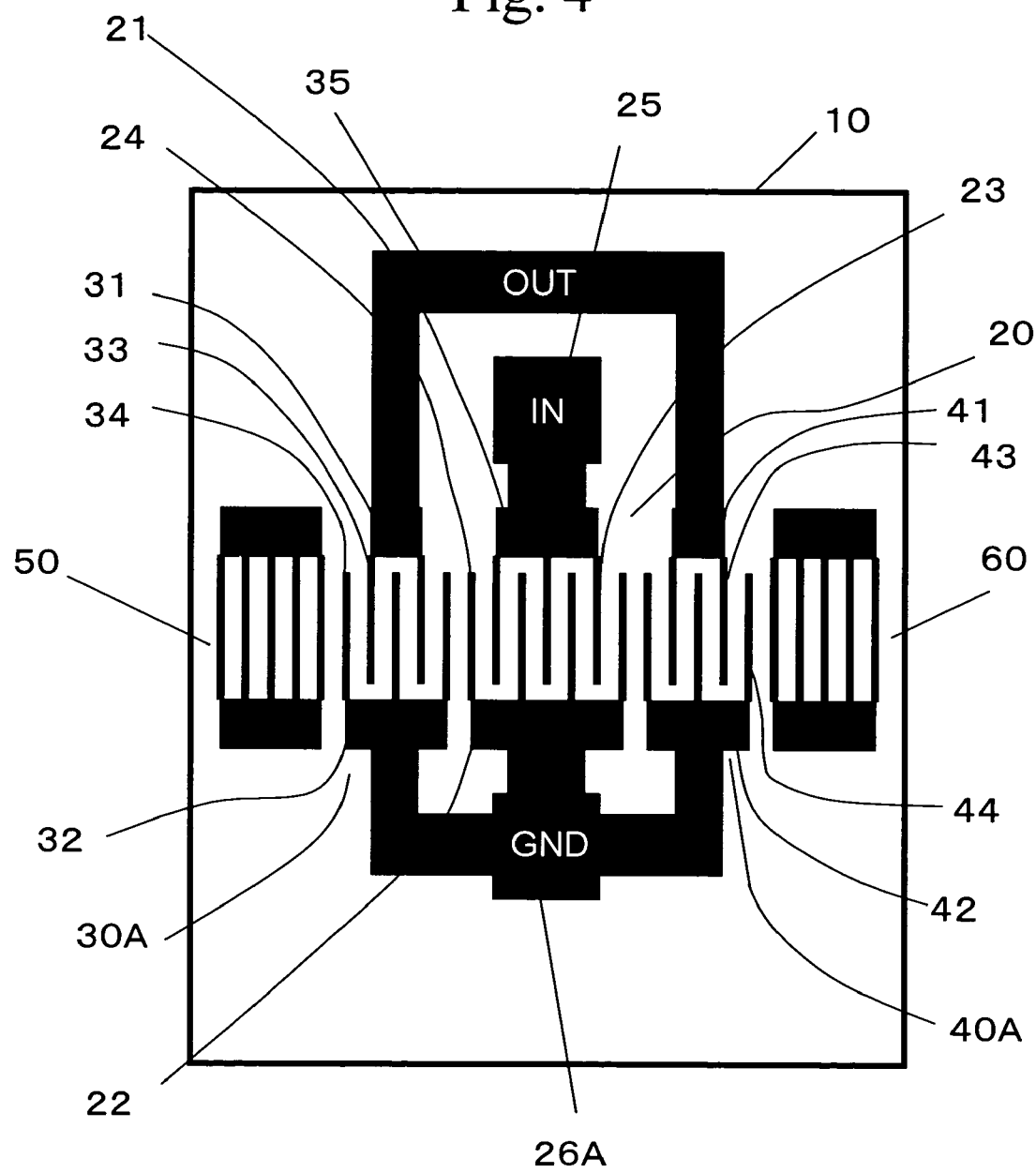
FIG. 4 illustrates a first modification of the first embodiment.

FIG. 4 illustrates a first modification of the first embodiment. In FIG. 4, the same components as those shown in FIG. 3 are denoted by the same reference numerals as those in FIG. 3. In the DMS filter shown in FIG. 4, the ground terminal 26 of the input IDT 20 of FIG. 3 is connected to the ground terminal 36 of the output IDTs 30A and 40A of FIG. 3 on the piezoelectric substrate 10, so that a common ground terminal 26A is formed.

Figure 5:
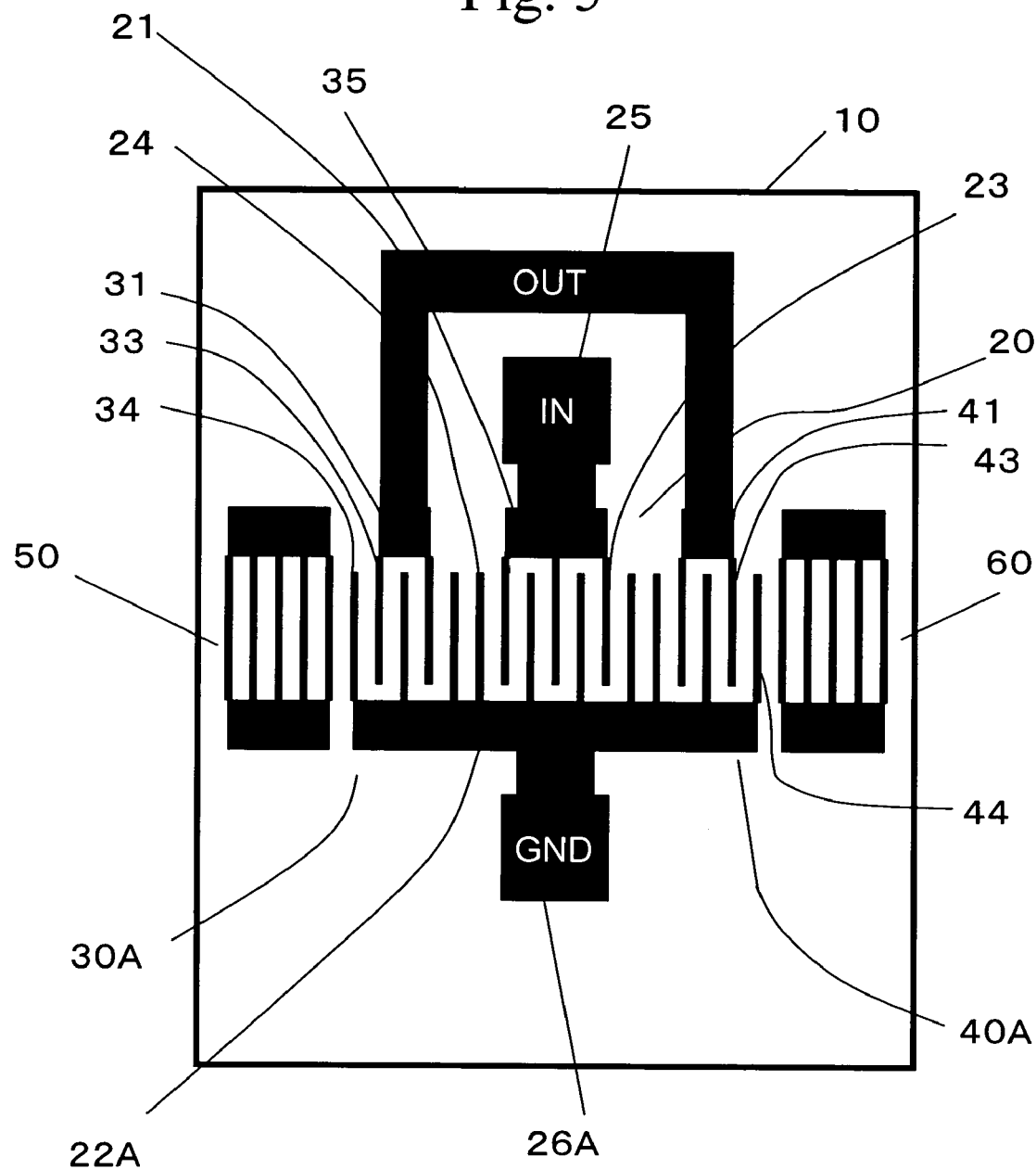
FIG. 5 illustrates a second modification of the first embodiment.

FIG. 5 illustrates a second modification of the first embodiment. In FIG. 5, the same components as those shown in FIG. 3 are denoted by the same reference numerals as the corresponding ones in FIG. 3. In the DMS filter device shown in FIG. 5, the ground bus bar 22 of the input IDT 20 is connected to the ground bus bars 32 and 42 of the output IDTs 30A and 40A on the piezoelectric substrate 10, so that a common ground bus bar 22A is formed.

In the structures shown in FIGS. 4 and 5, the ground potential of the input IDT 20 is equal to the ground potential of the output IDTs 30A and 40A on the piezoelectric substrate 10. With this structure, the steepness increased further, and the loss decreased further, as indicated by the bold solid line in FIG. 6.

Figure 7:
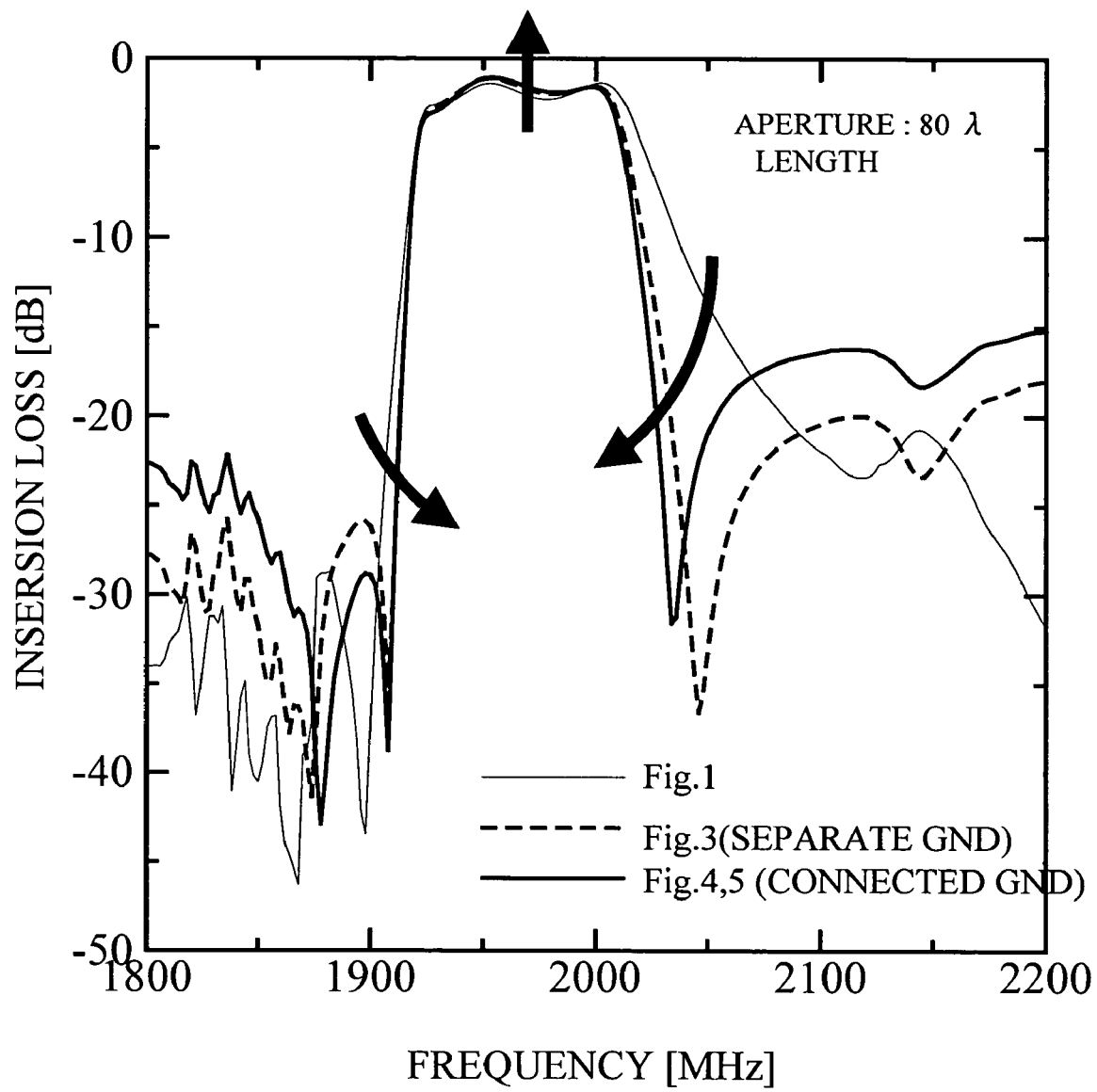
FIG. 7 shows the results of 1.9-GHz-band simulations carried out on the conventional DMS filter of FIG. 1 and the DMS filters of the first embodiment and the first and second modifications.

FIG. 7 shows the results of simulations in which the 1.9-GHz-band filter characteristics of the first embodiment and its modifications shown in FIG. 6 were reproduced. In FIG. 7, the thin solid line indicates the characteristics of the conventional DMS filter shown in FIG. 1, the broken line indicates the characteristics of the DMS filter of the first embodiment shown in FIG. 3, and the bold solid line indicates the characteristics of the DMS filters of the modifications shown in FIGS. 4 and 5. These simulation results also show that, with the input terminal 25 and the output terminal 35 being adjacent to each other (extending in the same direction), the steepness in the rising region and the declining region of the filter characteristics was much greater than the steepness obtained with the conventional structure. The insertion loss in the pass band also decreased. With the structure in which the ground potentials of the input IDT 20 and the output IDTs 30A and 40A are all equal on the piezoelectric substrate 10, as shown in FIGS. 4 and 5, the steepness increased further, and the loss decreased further.

Figure 8:
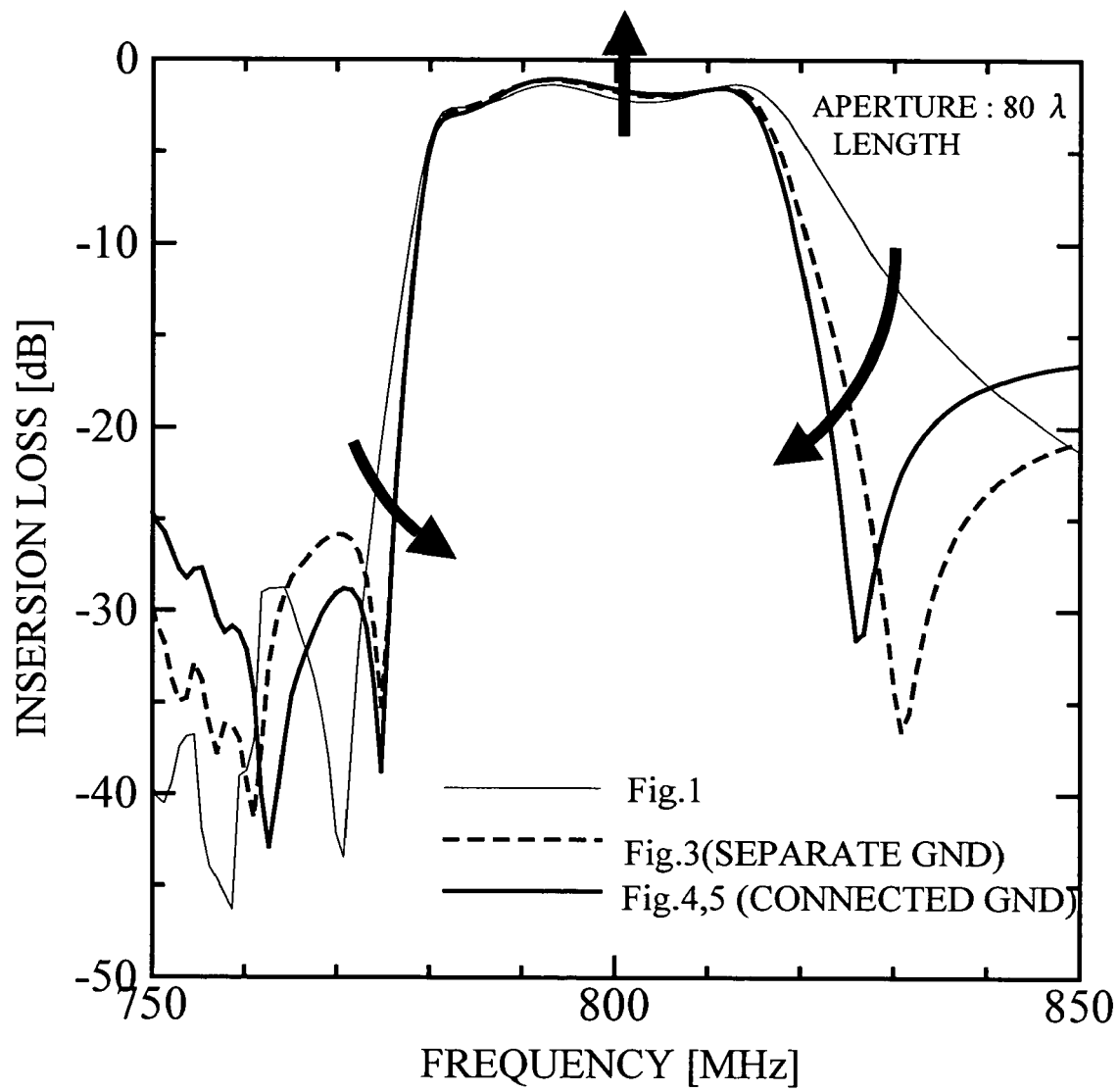
FIG. 8 shows the results of 800-MHz-band simulations carried out on the conventional DMS filter of FIG. 1 and the DMS filters of the first embodiment and the first and second modifications.
Figure 9:
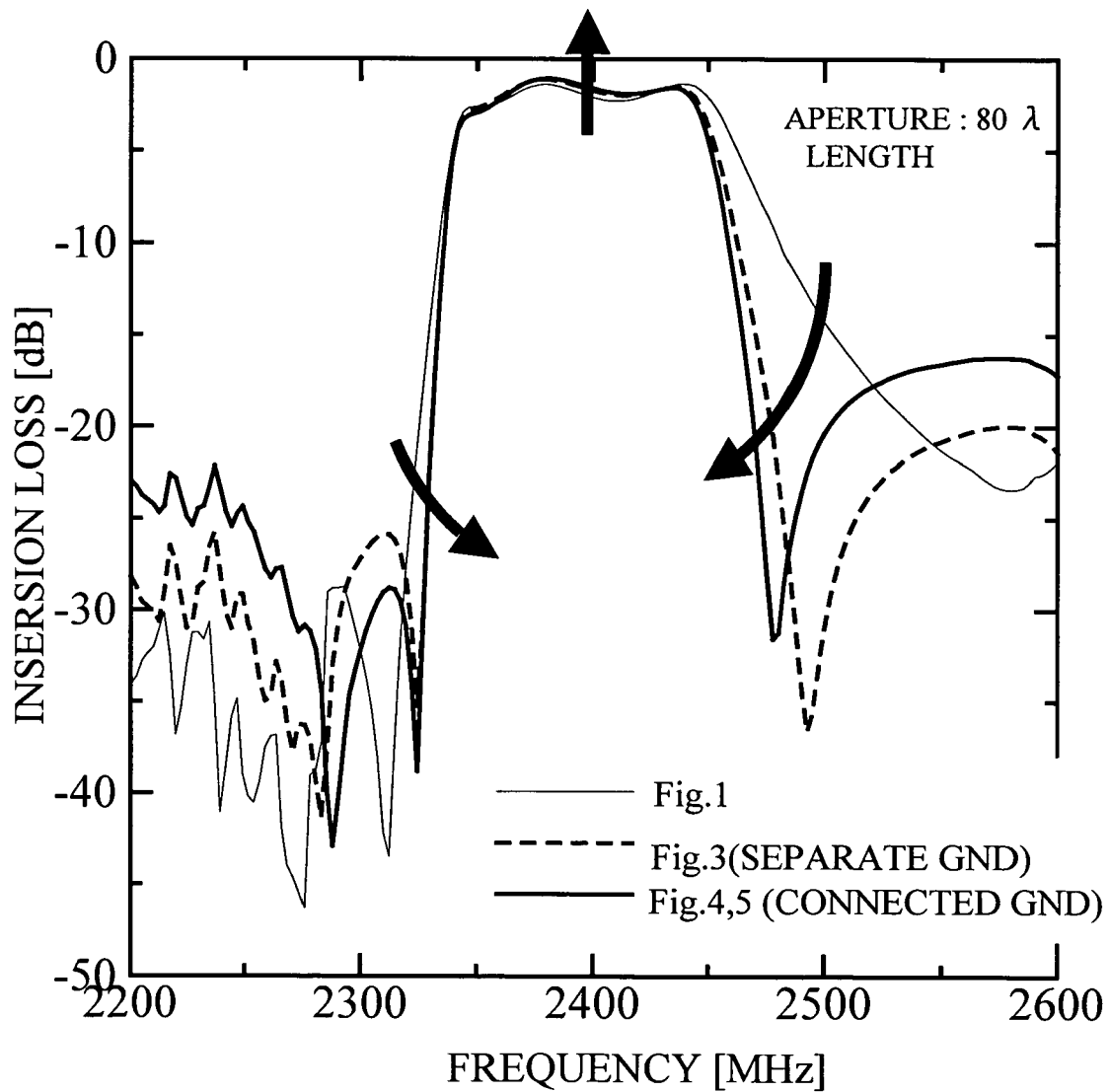
FIG. 9 shows the results of 2.4-GHz-band simulations carried out on the conventional DMS filter of FIG. 1 and the DMS filters of the first embodiment and the first and second modifications.

These simulation results are similar to the experiment results, and therefore, it is safe to say a suitable simulation method was used in the simulations. The same simulation method was also used to calculate the filter characteristics in other frequency bands, and the effects of the present invention on the characteristics in the frequency bands were examined. FIG. 8 shows the results of the calculations carried out on the filter characteristics in the 800 MHz band that is often used in mobile telephone communications. FIG. 9 shows the results of the calculations carried out on the filter characteristics in the 2.4 GHz band that is often used in wireless LANs or the likes. In the actual calculations, the electrode pitch, the aperture length, the electrode thickness, the bus bar width, the wiring patterns, and others, were analogously enlarged or reduced, so that the center frequency became 800 MHz or 2.4 GHz. In the calculations either in the 800 MHz band or the 2.4 GHz band, the steepness increased while the insertion loss decreased with any of the structures shown in FIGS. 3 through 5. Accordingly, it was confirmed that those structures shown in FIGS. 3 through 5 had the effect of improving characteristics in any frequency band, regardless of the center frequency of each filter.

Figure 10:
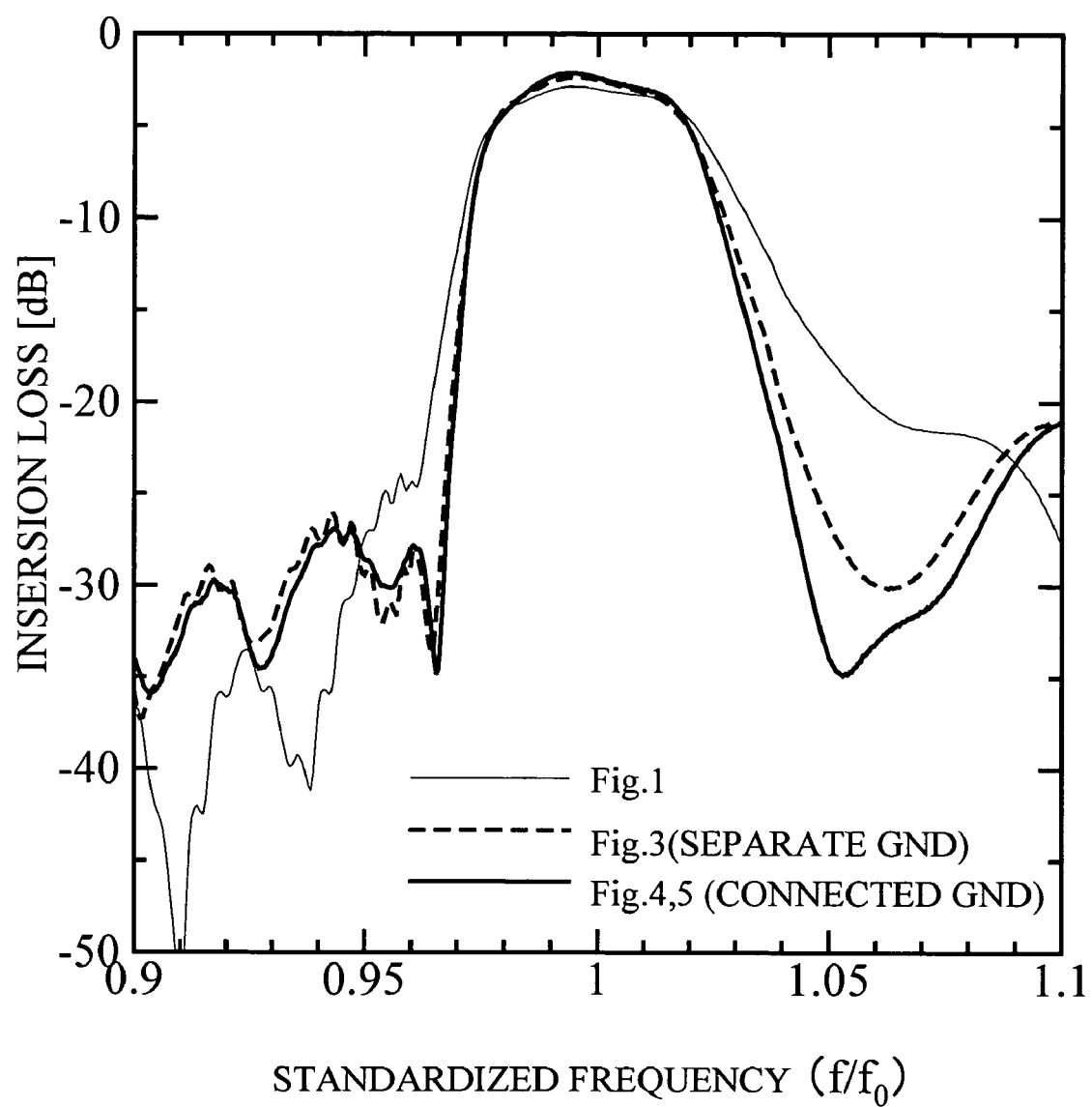
FIG. 10 shows standardized filter characteristics of the conventional DMS filter of FIG. 1 and the DMS filters of the first embodiment and the first and second modifications.
Figures 11A, 11B, 11C, 11D, 11E, 11F:
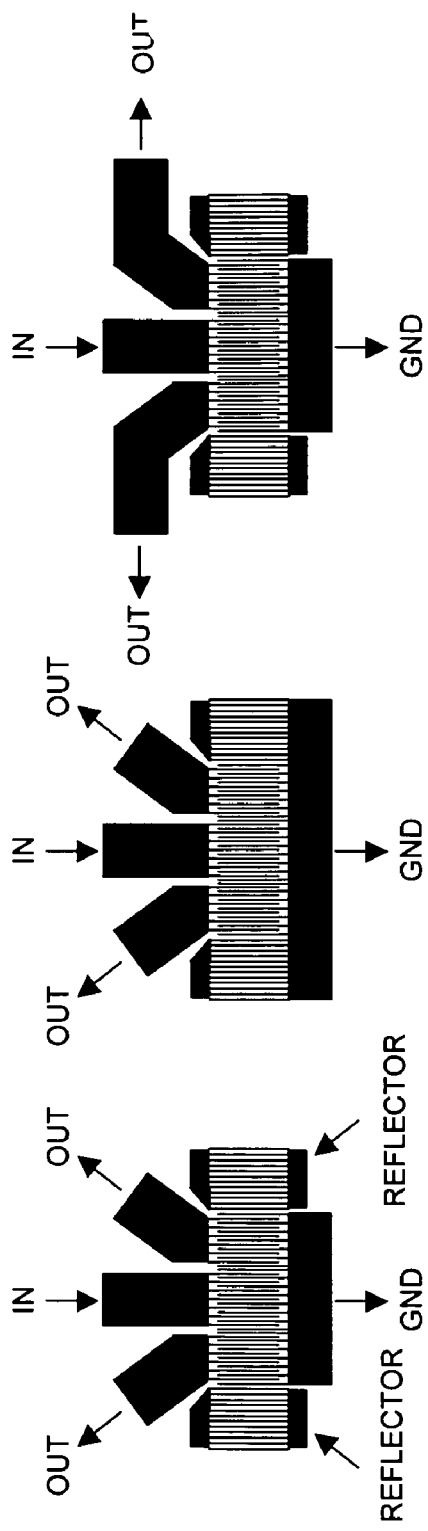
FIGS. 11A through 11L show wiring patterns that were used in experiments for the present invention.
Figure 11G:
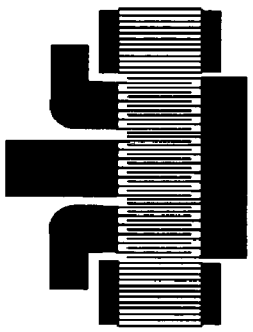
Figure 11H:
Figure 11I:
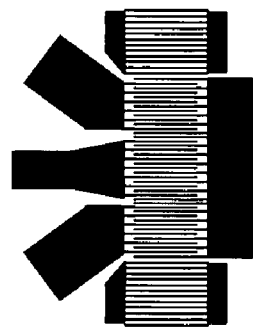
Figure 11J:
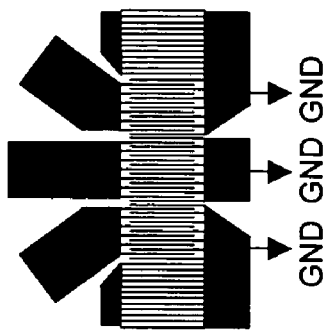
Figure 11K:
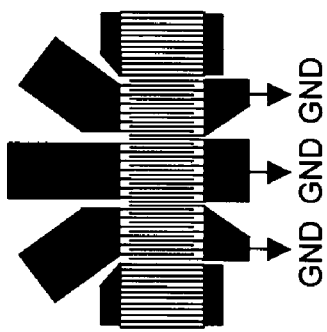
Figure 11L:
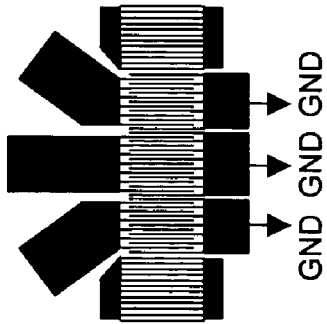

FIG. 10 shows filter characteristics that were obtained by standardizing (normalizing) the characteristics improving effects of the DMS filters shown in FIG. 6 using the center frequency of the DMS filters, with the above observations being taken into consideration. In FIG. 10, the abscissa axis indicates standardized frequency $f/f_0$ that is normalized with the center frequency $f_0$ of each filter, and the ordinate axis indicates insertion loss (dB). As can be seen from FIG. 10, the characteristics improving effect of each of the structures shown in FIGS. 3 through 5 is seen in any frequency band, regardless of the center frequency of each filter.

The characteristics improving effects of the first embodiment and its modifications, i.e., increases in the steepness and decreases in the insertion loss, can be obtained not only with the wiring layouts shown in FIGS. 3 through 5, but also with any of the wiring layouts shown in FIGS. 11A through 11L. FIGS. 11A through 11L show twelve different wiring layouts. In each of the wiring layouts, the input terminal for supplying input signals to the input IDT and the output terminals that receive output signals from the output IDTs extend in the same direction through the respective wiring patterns. Also, in any of the wiring layouts, the ground electrode fingers of the input IDT extend in the same directions as the ground electrode fingers of the output IDTs. The input wiring patterns and the output wiring patterns are denoted by "IN" and "OUT" only in FIGS. 11A, 11B, and 11C, but the denotations are omitted in the other drawings for convenience sake. In any of the wiring layouts, the input wiring pattern IN is interposed between two output wiring patterns OUT. In FIGS. 11A through 11L, the number of electrode finger pairs is 7.5 in each input IDT, and 6.5 in each output IDT. However, the number of electrode finger pairs of each IDT is not limited to the above. The number of electrode finger pairs may be 7 to 20 in an input IDT, and 6 to 18 in an output IDT, for example. Although not shown in the drawings, the number of electrodes that are actually employed in each of the reflectors is several tens to several hundreds. Filters were produced according to the twelve layouts shown in FIGS. 11A through 11L, and the characteristics of each of the filters were then evaluated. The evaluation results showed that the effects of increasing steepness and decreasing insertion loss were obtained with each of the filters of FIGS. 11A through 11L. This proves that, regardless of a small difference in the wiring layout, the same characteristics improving effects can be obtained with filters each having the input terminal and the output terminals extending in the same direction.

Second Embodiment

Figure 12:
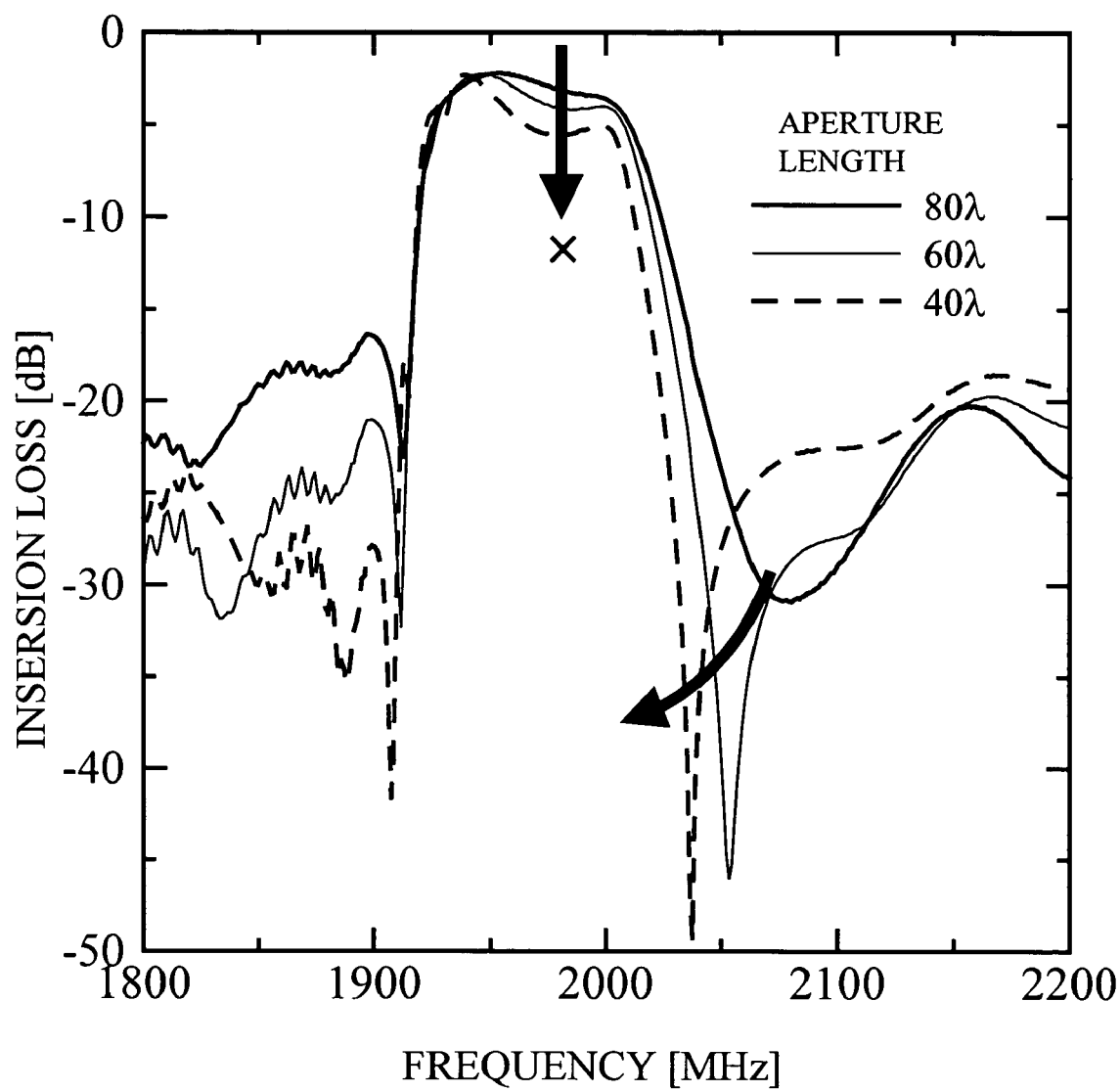
FIG. 12 shows the filter characteristics of the first embodiment and the first and second modifications, with the IDT aperture length being varied.

A second embodiment of the present invention will now be described. The second embodiment has a structure that can increase the steepness in the declining region of the filter characteristics more than that in the first embodiment, and can reduce the insertion loss even further. Changes in the characteristics were first observed as to a structure having the input terminal and the output terminal adjacent to each other, with the aperture length W of each IDT being varied. The electrode structure used in this experiment is the same as the structure shown in FIG. 5, having a shared ground bus bar (the common ground bus bar 22A). The experiment results are shown in FIG. 12. From these results, it was found that the declining region of the filter characteristics on the high-frequency side shifted toward the low-frequency side after the aperture length was reduced, and that the steepness in the declining region increased. However, as the aperture length became smaller, the shape of the characteristics curve in the pass band was deformed, and the insertion loss greatly increased. This is because an IDT electrostatic capacitance decrease was caused by the decrease of the aperture length, and resulted in input/output impedance mismatching.

Figure 13A:
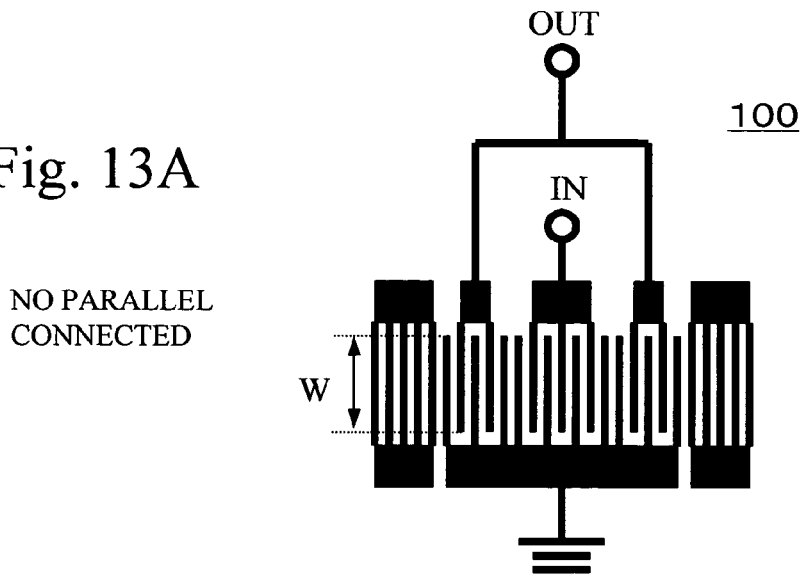
FIGS. 13A through 13C illustrate structures in which filters of the second modification are connected in parallel in accordance with a second embodiment of the present invention.
Figure 13B:
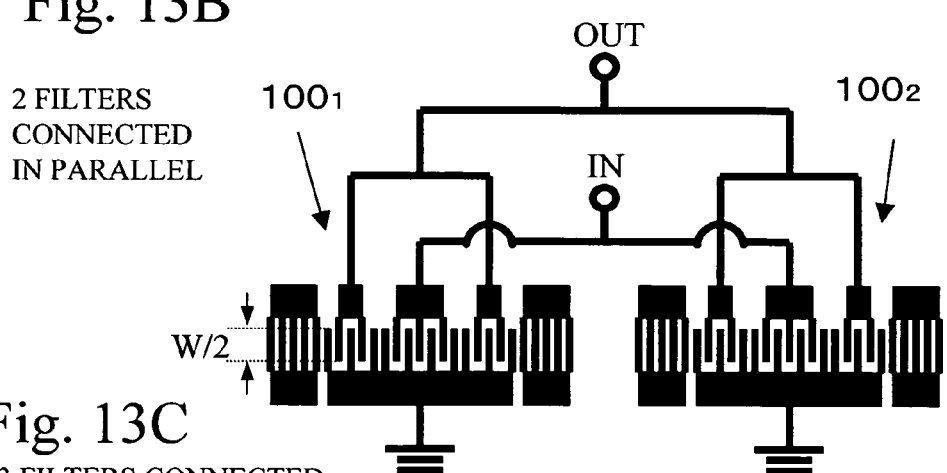
Figure 13C:
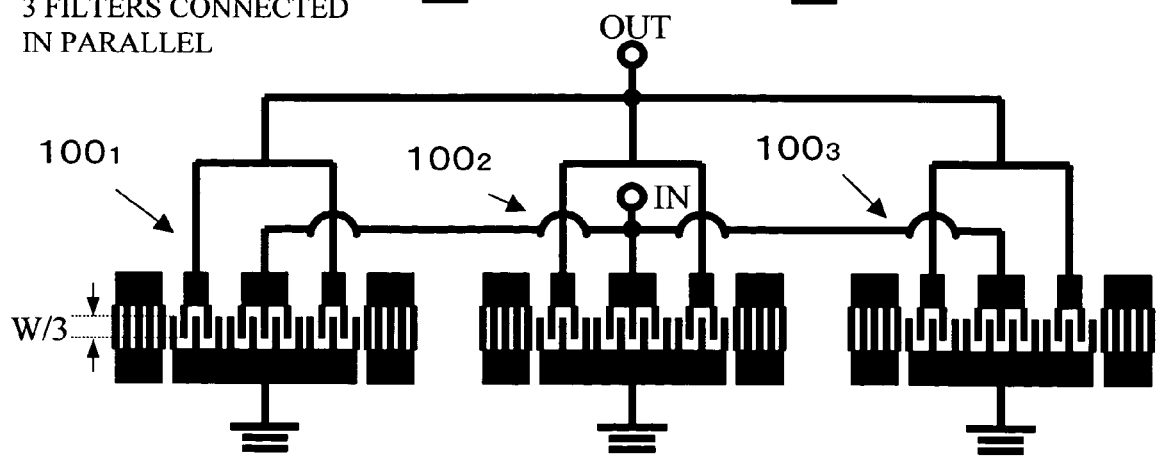
Figure 14:
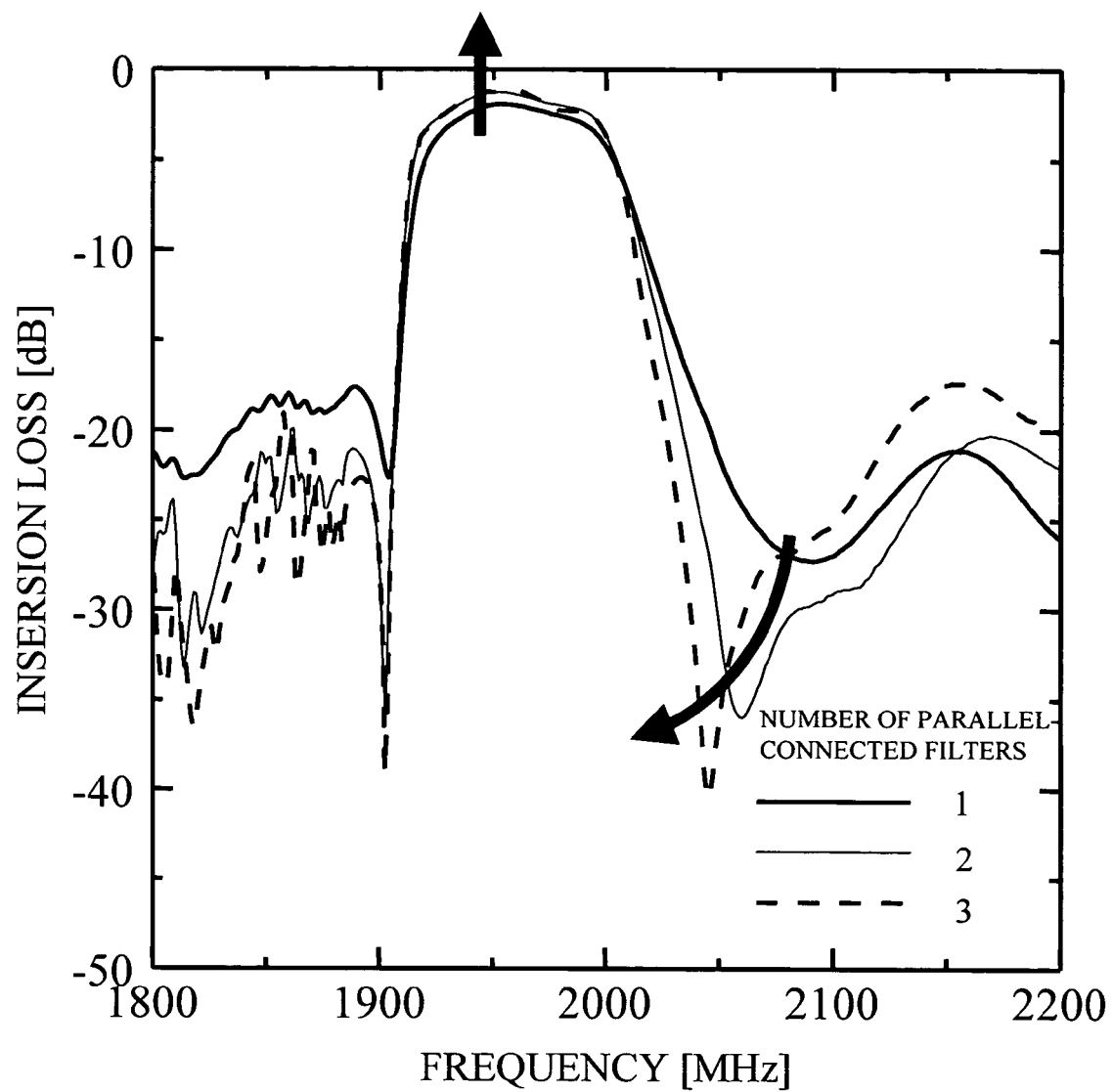
FIG. 14 shows filter characteristics differences caused by differences in the number of filters connected in parallel.

To solve this problem of impedance mismatching, DMS filters having the same structures as one of those shown in FIGS. 3 through 5 were connected in parallel. FIGS. 13A through 13C show examples of such DMS filters connected in parallel. In FIGS. 13A through 13C, the DMS filter shown in FIG. 5 is used. If the aperture length of a DMS filter 100 (shown in FIG. 13A) in which impedance matching is maintained with the aperture length W is reduced to 1/N (N being an integer) of the aperture length W, the IDT electrostatic capacitance also becomes 1/N of its original quantity. Therefore, N of DMS filters each having the aperture length of 1/N of the aperture length W are electrically connected in parallel, so that the total electrostatic capacitance becomes equal to the electrostatic capacitance of a DMS filter having the aperture length W. By doing so, impedance matching can be maintained with DMS filters having smaller aperture lengths, and a great steepness can be achieved in the declining region of the filter characteristics. Here, the DMS filters to be connected in parallel should preferably have the same pass bands. If the DMS filters have different pass bands, spurious peaks might appear in the pass bands. The inventors actually manufactured, as experiments, a 1.9-GHz-band filter having two DMS filters $100_1$ and $100_2$ (N being 2) connected in parallel, and another 1.9-GHz-band filter having three DMS filters $100_1$, $100_2$, and $100_3$ (N being 3) connected in parallel, as shown in FIGS. 13B and 13C. The results of evaluation made on these filters are shown in FIG. 14. As the number of DMS filters connected in parallel became larger, the aperture length of each DMS filter became smaller, and the steepness in the declining region of the filter characteristics increased, accordingly. When N of DMS filters were connected in parallel, the aperture length of each DMS filter became 1/N of the original aperture length W, and the number of IDT electrode finger pairs was multiplied by N. Accordingly, the IDT resistance greatly decreased to $1/N^2$ of the original IDT resistance. As a result, the insertion loss greatly decreased.

Figure 15:
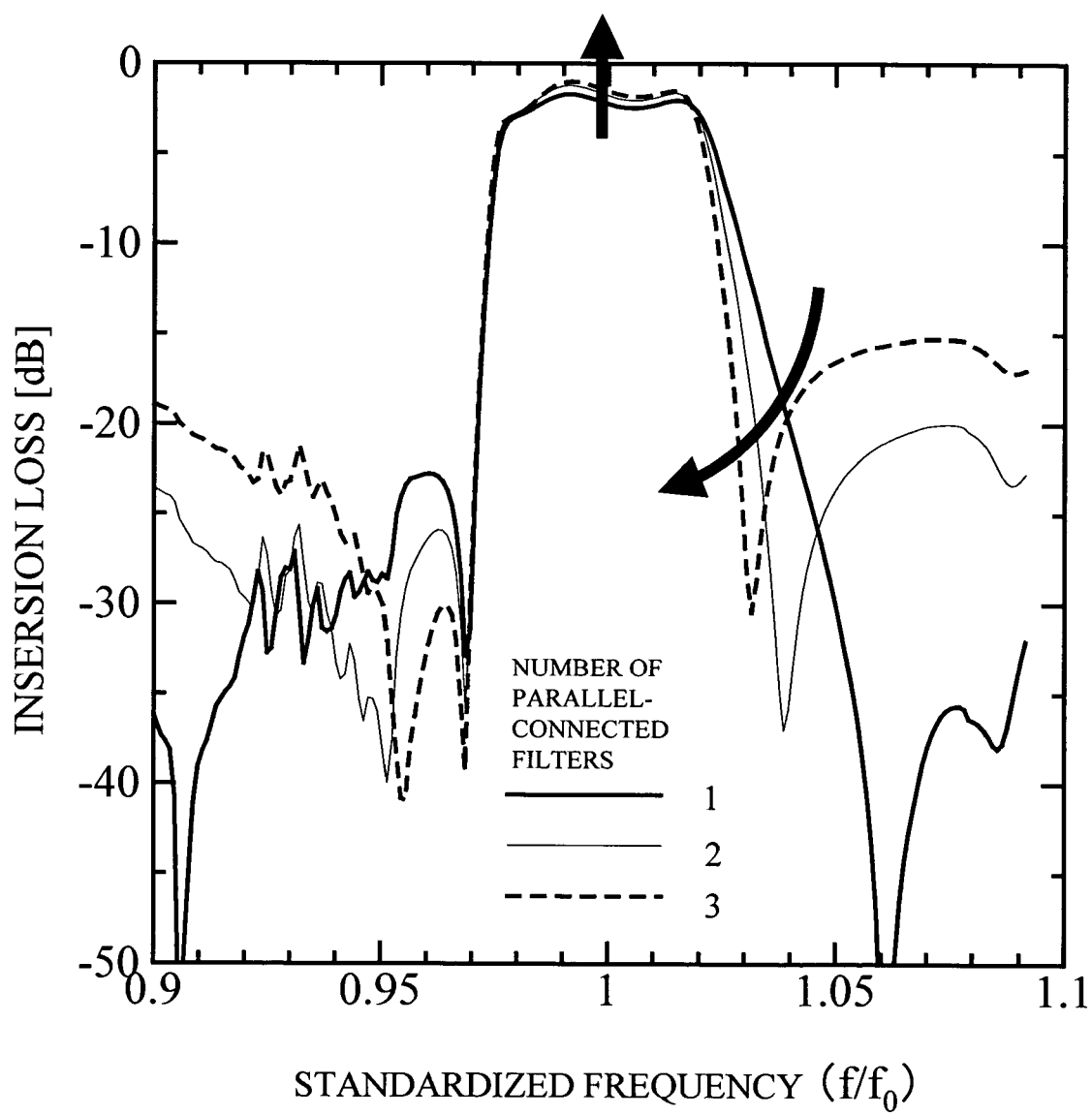
FIG. 15 shows the results of simulations carried out on the structures shown in FIGS. 13A through 13C.

The frequency characteristics of the DMS filters shown in FIGS. 13A through 13C were calculated in frequency bands other than the 1.9 GHz band in the same manner as in the simulations shown in FIGS. 7 through 9. The calculations were carried out in the 800 MHz band and the 2.4 GHz band, as in the simulations shown in FIGS. 7 through 9, and the results were substantially the same as the results of calculations carried out in the 1.9 GHz band. The simulation results are shown in FIG. 15. In FIG. 15, the abscissa axis indicates standardized frequency $f/f_0$, and the ordinate axis indicates insertion loss (dB). The calculation results are very similar to the experiment results of the experimental DMS filters. More specifically, as the number of DMS filters connected in parallel increases, the insertion loss decreases, and the steepness in the declining region of the filter characteristics increases. This leads to a conclusion that DMS filters connected in parallel exhibit the effect of improving filter characteristics in any frequency band, regardless of the center frequency of each DMS filter.

Figure 16:
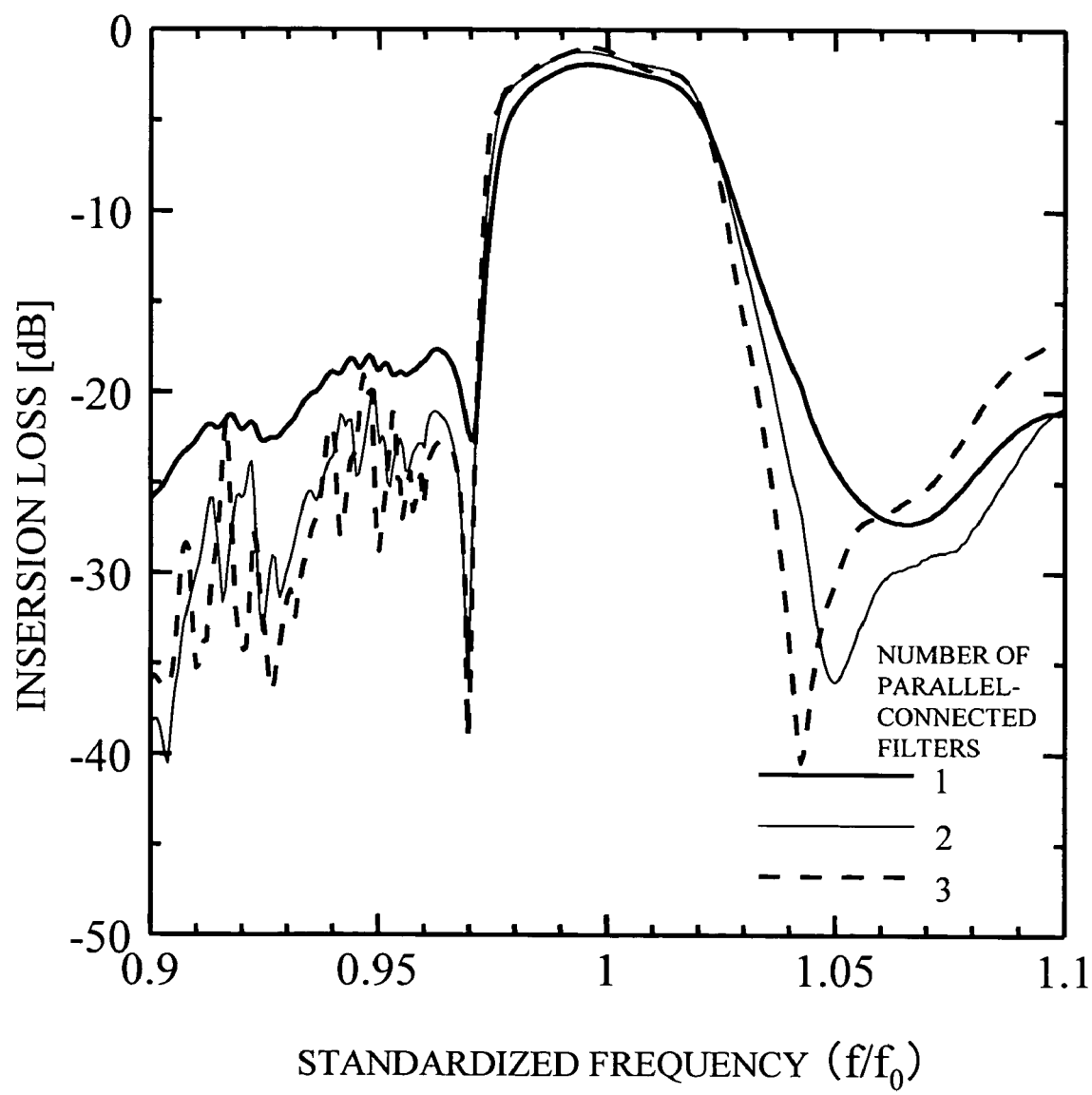
FIG. 16 shows standardized filter characteristics of the structures shown in FIGS. 13A through 13C.

FIG. 16 shows filter characteristics that were obtained by standardizing the characteristics improving effects of the DMS filters shown in FIG. 14, with the center frequency of the DMS filters being the standard. In FIG. 16, the abscissa axis indicates standardized frequency $f/f_0$ that is normalized with the filter center frequency $f_0$, and the ordinate axis indicates insertion loss (dB). The characteristics improving effects of DMS filters connected in parallel are seen with filters of any frequency band, regardless of the center frequency of each filter.

Third Embodiment

Next, a third embodiment of the present invention will be described, with the filter arrangement of SAW filters connected in parallel being one of the features. In the following, a structure having two filters connected in parallel will be used as an example.

Figure 17:
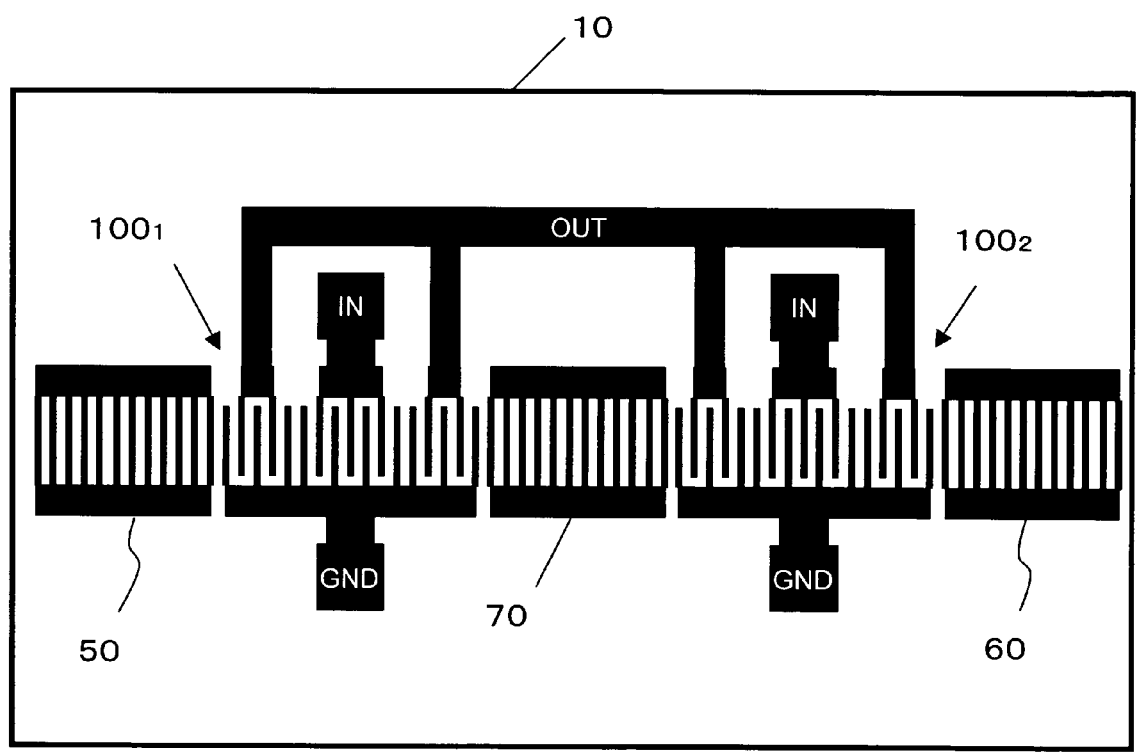
FIG. 17 illustrates a filter structure in accordance with a third embodiment of the present invention.

FIG. 17 shows an arrangement that can realize the smallest possible filter size. Two DMS filters $100_1$ and $100_2$ are aligned so as to have the same SAW propagation directions. A common reflector 70 is provided between the two DMS filters $100_1$ and $100_2$. This common reflector 70 serves as a common reflector for the two DMS filters $100_1$ and $100_2$. With this arrangement, the area of one reflector can be saved, and the filter size can be reduced accordingly.

Figure 18:
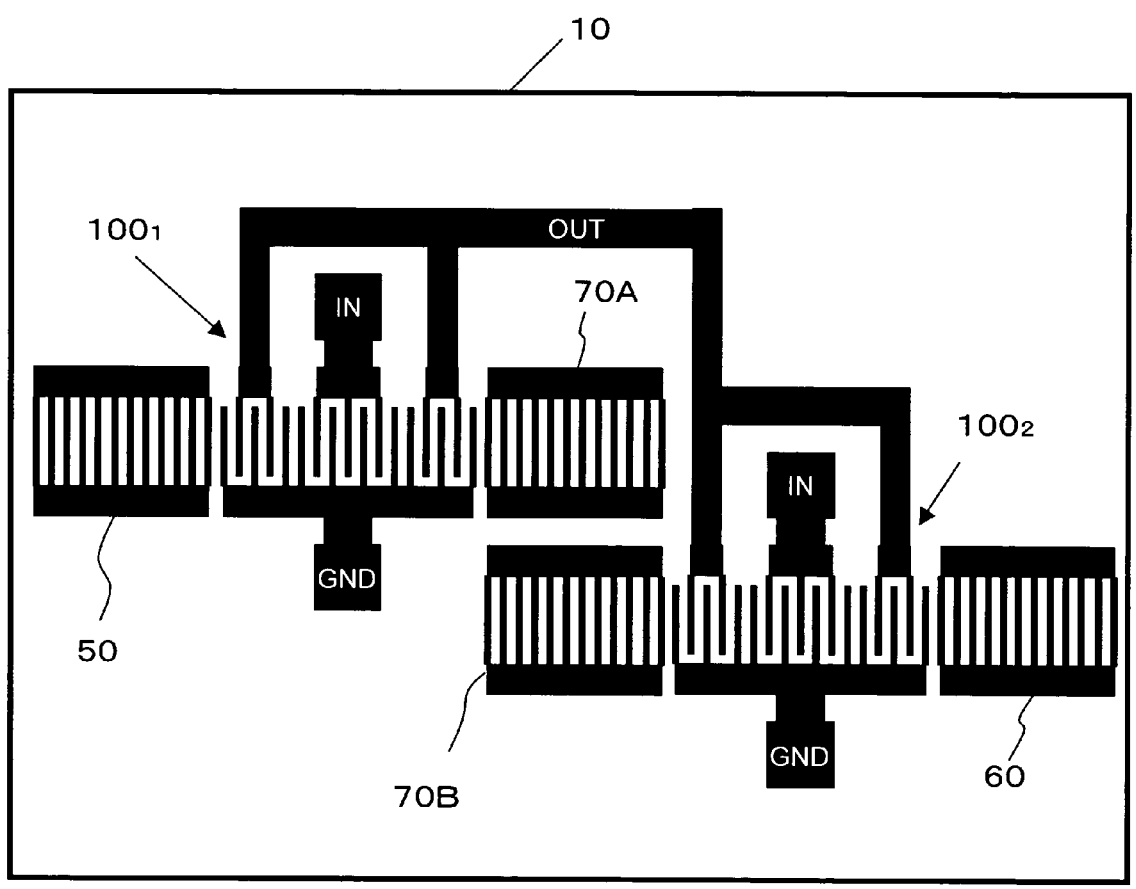
FIG. 18 illustrates a modification of the filter structure shown in FIG. 17.

FIG. 18 illustrates the structure of a SAW filter in which the two DMS filters are arranged so as to have different SAW propagation paths. The common reflector 70 is divided into two reflectors 70A and 70B. The reflector 70A serves as a reflector for the DMS filter $100_1$, while the reflector 70B serves as a reflector for the DMS filter $100_2$. The reflectors 70A and 70B are aligned in the perpendicular direction to the SAW propagation direction.

Figure 19:
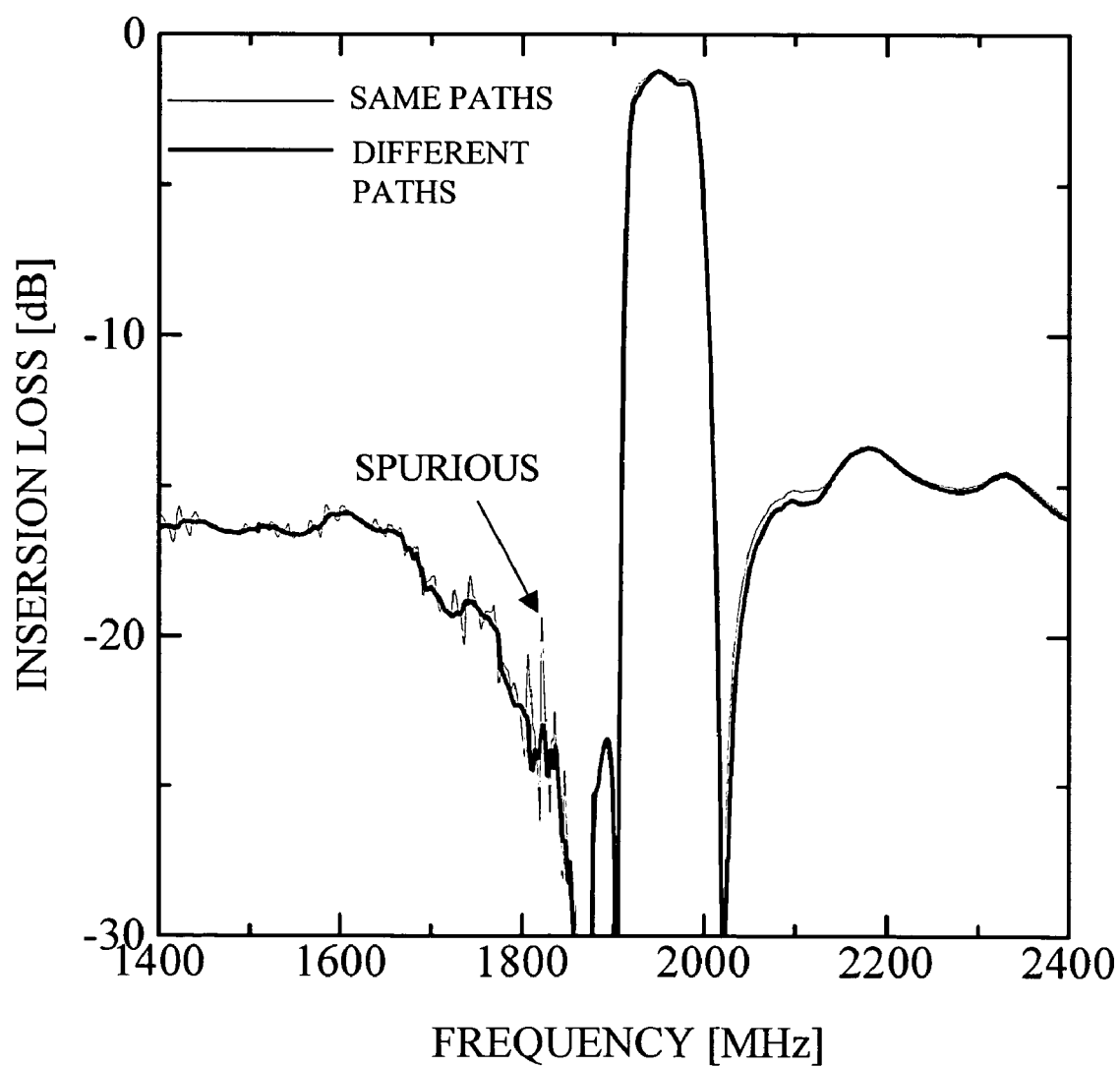
FIG. 19 shows the characteristics difference between the structure with uniform propagation paths shown in FIG. 17 and the structure with different propagation paths shown in FIG. 18.

FIG. 19 shows the characteristics of the SAW filter of FIG. 17 and the characteristics of the SAW filter of FIG. 18. As can be seen from FIG. 19, the characteristics of the SAW filter of FIG. 17 have small spurious peaks on the low-frequency side of the pass band, though the two SAW filters exhibit similar filter characteristics. The spurious peaks are formed due to surface acoustic waves reaching the other DMS filter through the common reflector 70, and might cause a problem.

Figure 20:
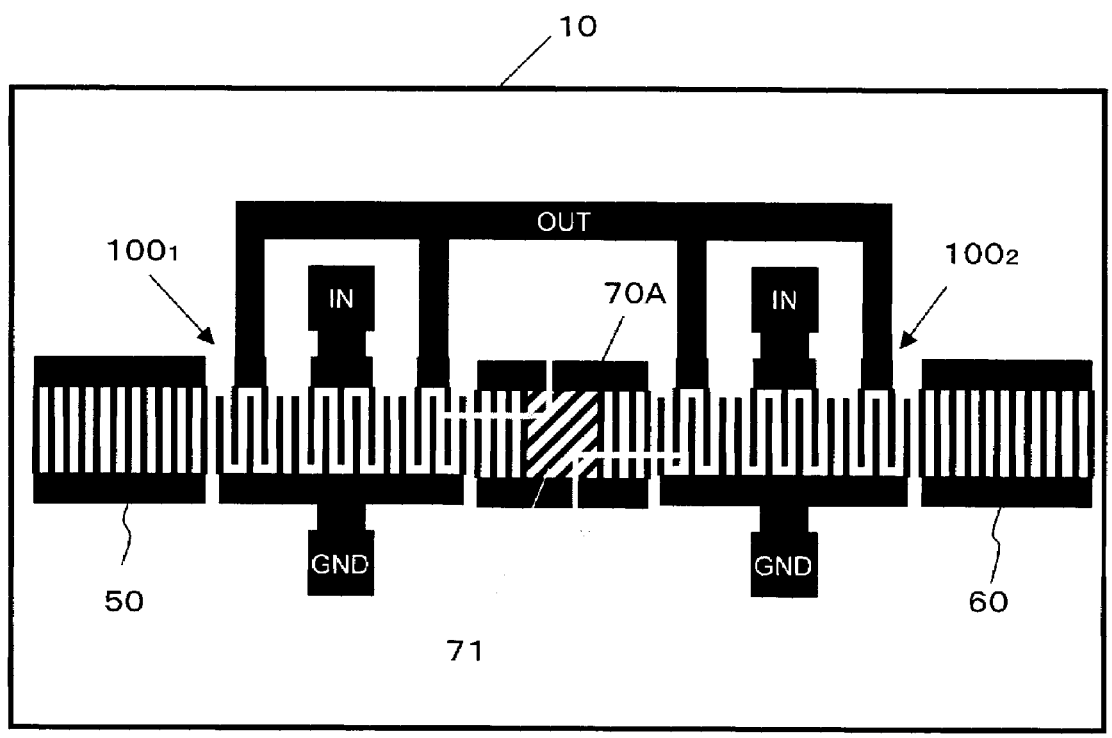
FIG. 20 illustrates a filter structure having diagonal grating electrodes as a modification of the third embodiment.
Figure 21:
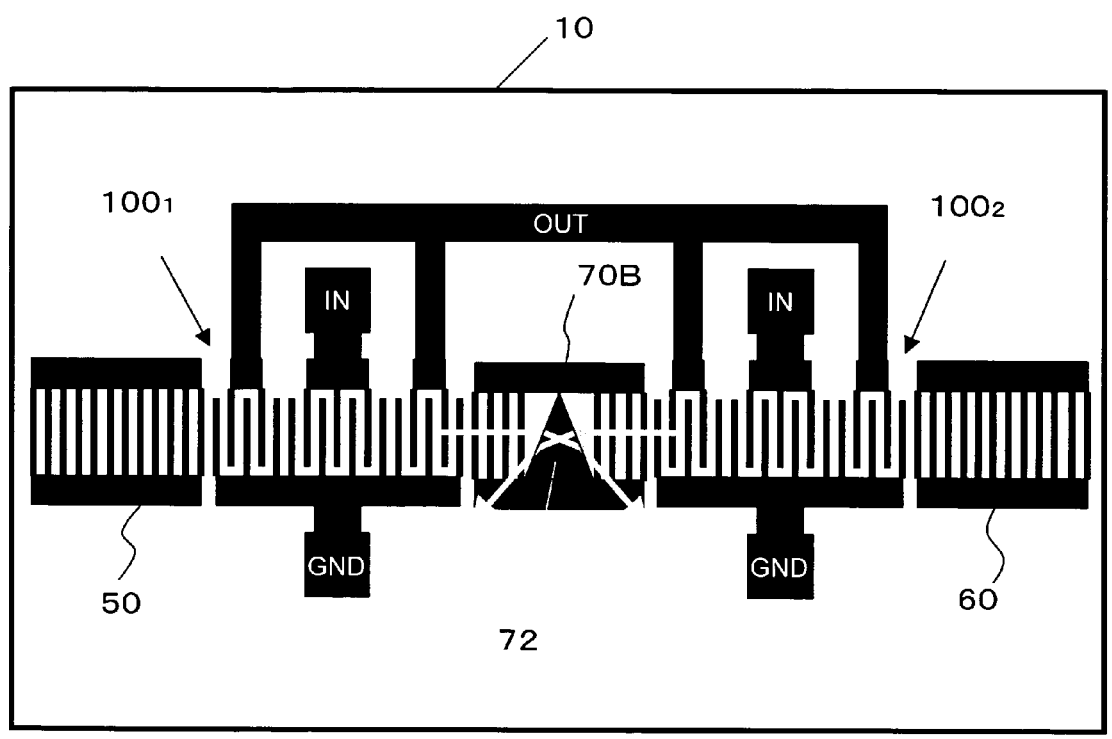
FIG. 21 illustrates a filter structure having a prism pattern as another modification of the third embodiment.

In order to reduce such spurious peaks, the inventors developed structures that can prevent surface acoustic waves from passing through the common reflector 70 of FIG. 17. These structures are shown in FIGS. 20 and 21. The structure shown in FIG. 20 has diagonal grating electrodes 71 inside a common reflector 70A between the two DMS filters $100_1$ and $100_2$. The diagonal grating electrodes 71 extend in a direction not perpendicular to the SAW propagation direction (or, not in parallel with the reflector electrodes). As the diagonal grating electrodes 71 bend the SAW propagation paths, surface acoustic waves are prevented from passing through the common reflector.

The structure of the SAW filter shown in FIG. 21 has a triangular prism pattern (a solid pattern) 72 inside a reflector 70B between the two DMS filters $100_1$ and $100_2$. When entering the prism pattern 72, surface acoustic waves are bent by virtue of a difference in propagation speed. Accordingly, surface acoustic waves are prevented from passing through the common reflector. With either of the structures shown in FIGS. 20 and 21, spurious peaks outside the pass band can be suppressed, and a small-sized filter can be realized.

The present invention can be readily applied not only to DMS filters each having one input IDT and two output IDTs, but also to multi-mode SAW filters each having, for example, two input IDTs and three output IDTs, thereby providing excellent SAW filters that exhibit low insertion losses and steep cut-off characteristics.

Fourth Embodiment

Figure 22:
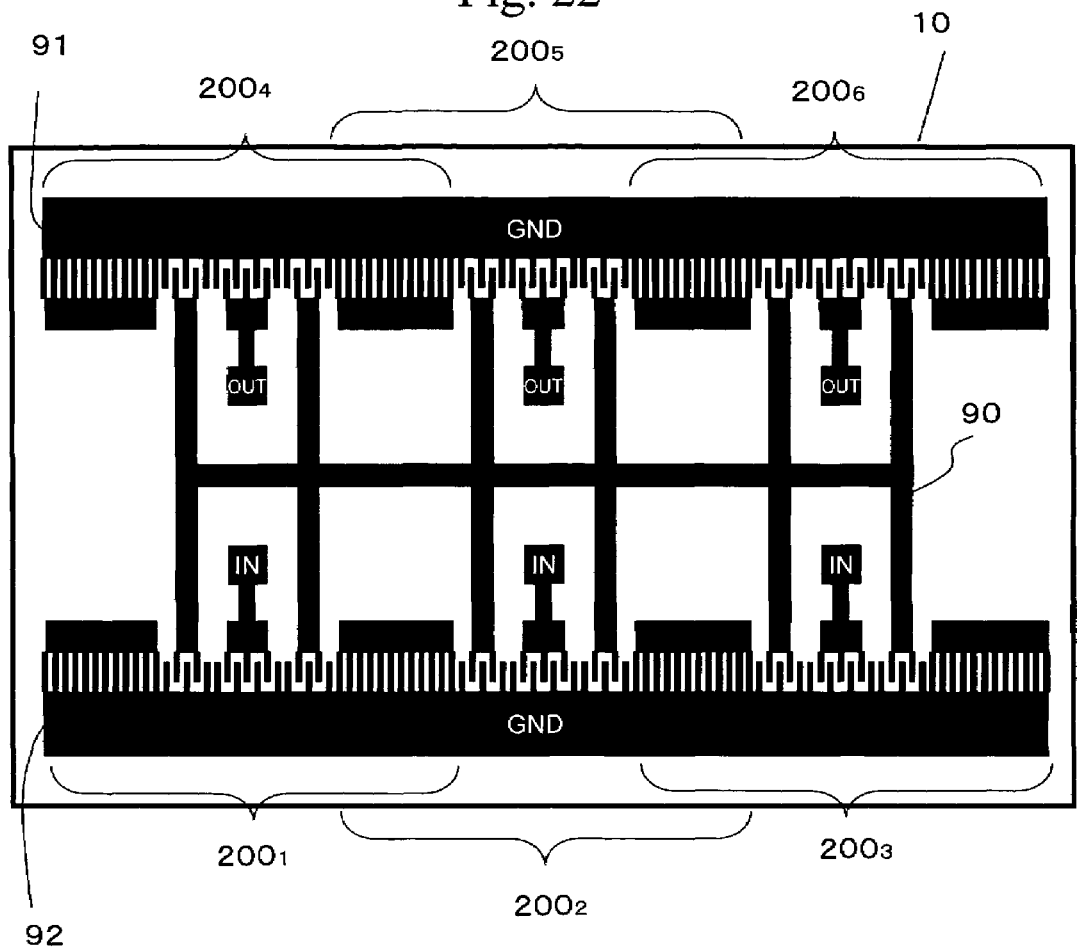
FIG. 22 illustrates a filter structure in accordance with a fourth embodiment of the present invention.

FIG. 22 illustrates a filter structure in accordance with a fourth embodiment of the present invention. This filter structure includes two cascaded sets or stages of DMS filters. In this filter structure, each set has three DMS filters connected in parallel. With the two sets of cascaded DMS filters, the stop-band suppression can be at least doubled. The three DMS filters of the first set are denoted by reference numerals $200_1$, $200_2$, and $200_3$, while the three DMS filters of the second set are denoted by reference numerals $200_4$, $200_5$, and $200_6$. The DMS filters $200_1$, $200_2$, and $200_3$ of the first set each has one input IDT and two output IDTs. The DMS filters $200_4$, $200_5$, and $200_6$ of the second set each has two input IDTs and one output IDT. The input IDTs of the DMS filters $200_4$, $200_5$, and $200_6$ of the second set are connected to the output IDTs of the DMS filters $200_1$, $200_2$, and $200_3$ of the first set via common signal lines 90.

The DMS filters $200_1$, $200_2$, and $200_3$ of the first set have a common ground bus bar 91. The ground electrode fingers of the input IDTs and the output IDTs and the electrode fingers of the common reflectors of the first set extend from the common ground bus bar 91. Likewise, the DMS filters $200_4$, $200_5$, and $200_6$ of the second set have a common ground bus bar 92. The ground electrode fingers of the input IDTs and the output IDTs and the electrode fingers of the common reflectors of the second set extend from the common ground bus bar 92. In this manner, the ground terminals of the DMS filters connected in parallel are connected to one another in each set on the piezoelectric substrate 10. With this arrangement, the ground terminals of the DMS filters of each set can be connected to the ground terminal of a package with only one bonding wire or one bonding bump. Accordingly, the packaging process can be simplified. Also, the DMS filters connected in parallel are aligned on the same propagation path in each set, so that reflectors can be shared among the filters, and the filter size can be reduced accordingly.

Figure 23:
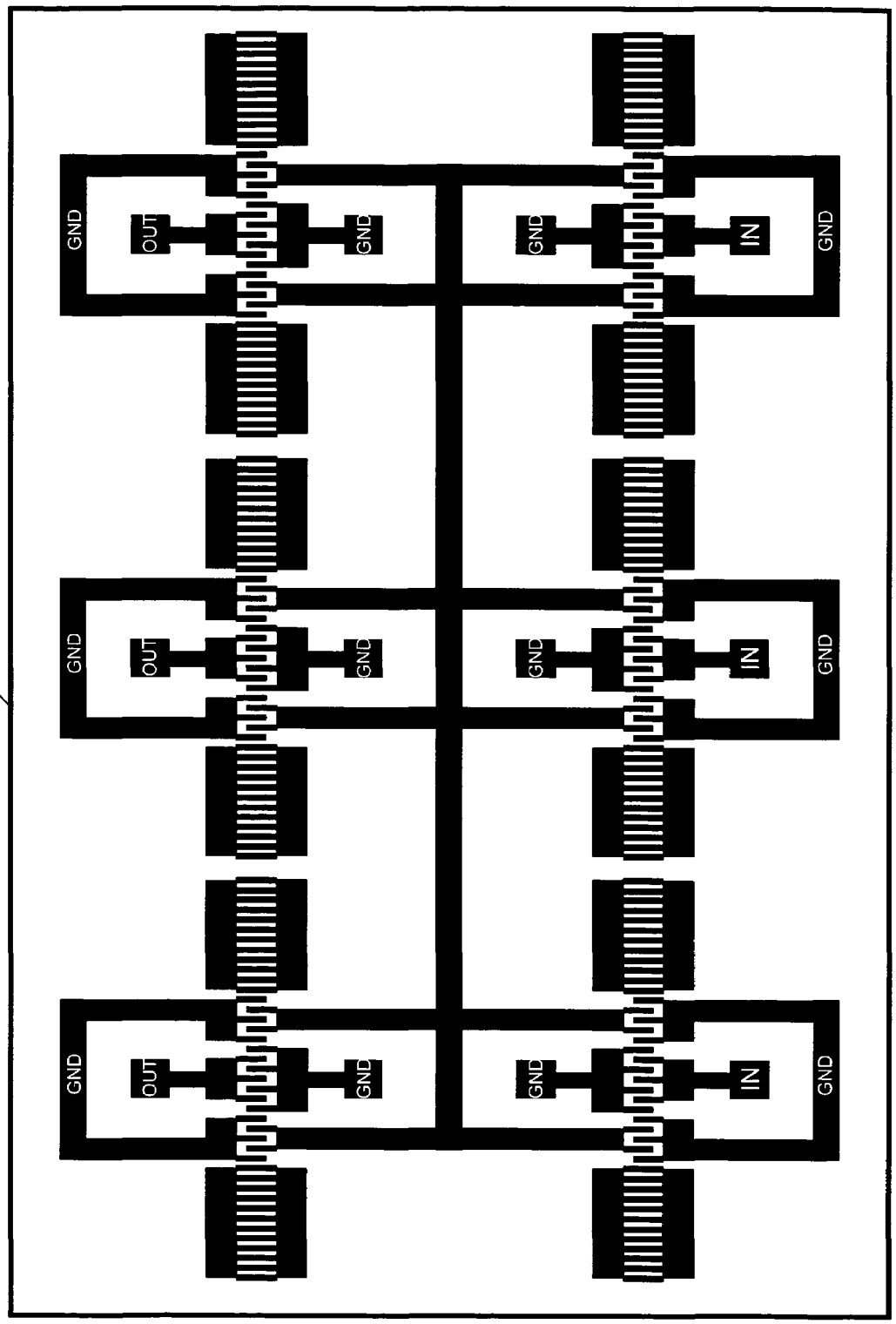
FIG. 23 illustrates a comparative example in which two sets or stages of three DMS filters connected in parallel are cascaded to each other.

As four reflectors are shared among the DMS filters in the structure shown in FIG. 22, the area equivalent to the four reflectors is saved in this structure. As a comparative example, FIG. 23 shows a structure in which two sets of three parallel-connected conventional DMS filters are longitudinally coupled with each other or cascaded. Since the reflectors are not shared among the filters in this structure, the filter size in the SAW propagation direction is larger than that of the structure shown in FIG. 22. Also, since the ground terminals of the parallel-connected DMS filters of each set are not connected to one another on the piezoelectric substrate 10, there exist a large number of ground terminals, and at least six bonding wires or six bonding bumps are required for connecting each set to the ground terminal of a package. As a result, the packaging process becomes complicated.

Figure 24:
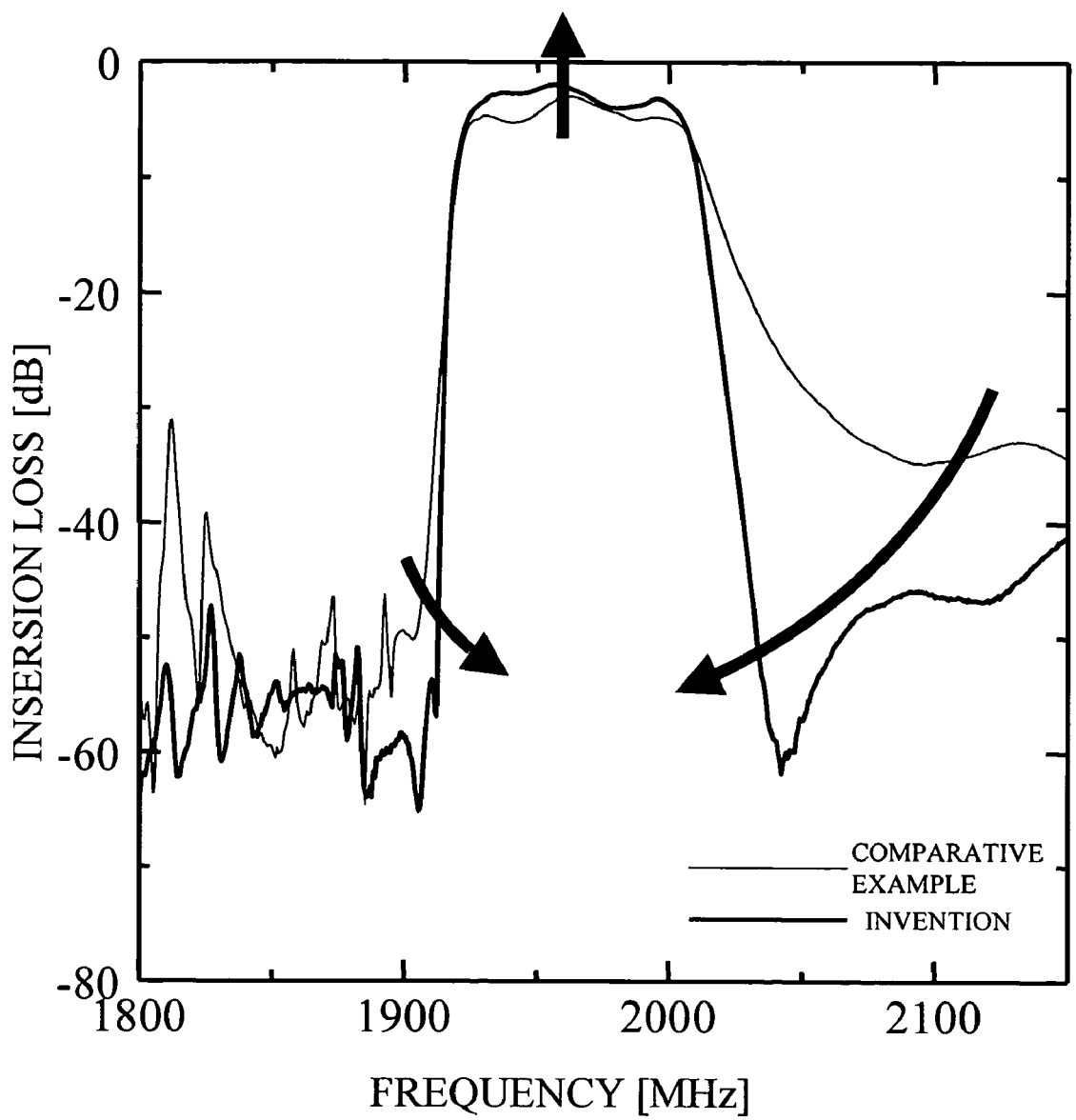
FIG. 24 shows the filter characteristics of the fourth embodiment and the comparative example.

FIG. 24 shows a comparison between the 1.9-GHz-band filter characteristics of the SAW filter of the fourth embodiment shown in FIG. 22, and the filter characteristics of the comparative example shown in FIG. 23. In FIG. 24, the abscissa axis indicates frequency (MHz), and the ordinate axis indicates insertion loss (dB). As already mentioned, the SAW filter of the present invention has the input terminal and the output terminal adjacent to each other (i.e., the ground electrode fingers of the input IDTs extend in the same direction as the ground electrode fingers of the output IDTs in the SAW filter of the present invention). Accordingly, the rising region and the declining region of the filter characteristics are steep, as shown in FIG. 24. Also, the insertion loss in the pass band is reduced by 1 dB or more. Furthermore, the SAW filter of this embodiment has three DMS filters connected in parallel, the aperture length of each DMS filter is ⅓ of the aperture length of a DMS filter that is not connected in parallel with any other filter. This further increases the steepness in the declining region of the filter characteristics. As a result, the lump-like shoulder that is seen in the stop-band area on the high-frequency side in the prior art is eliminated, and a high-performance filter is obtained.

Figure 25:
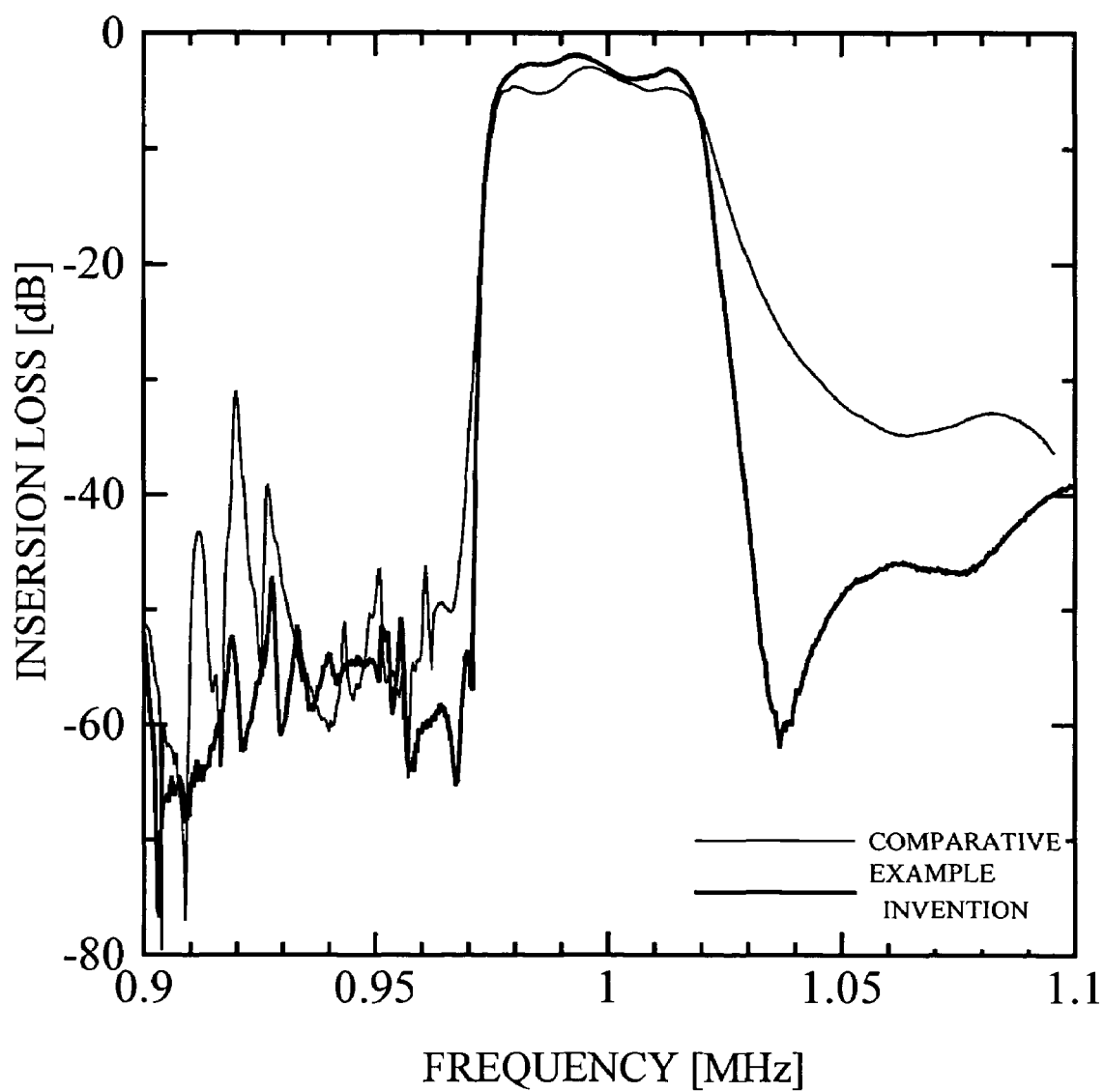
FIG. 25 shows standardized filter characteristics of the fourth embodiment and the comparative example.

The same effects as the effects shown in FIG. 24 can also be obtained in the 800 MHz band and the 2.4 GHz band. FIG. 25 shows filter characteristics that were obtained by standardizing the filter characteristics of the fourth embodiment. The filter characteristics shown in FIG. 25 can be obtained with any pass-band frequency.

Fifth Embodiment

Since the three parallel-connected DMS filters $200_1$, $200_2$, and $200_3$ ($200_4$, $200_5$, and $200_6$) are aligned on the same propagation path in each set, small spurious peaks are seen on the low-frequency side of the pass band in the fourth embodiment. The required stop-band suppression might not be obtained due to the spurious peaks. To avoid such a problem, a triangular prism pattern is provided between each two neighboring filters connected in parallel in a fifth embodiment of the present invention.

Figure 26:
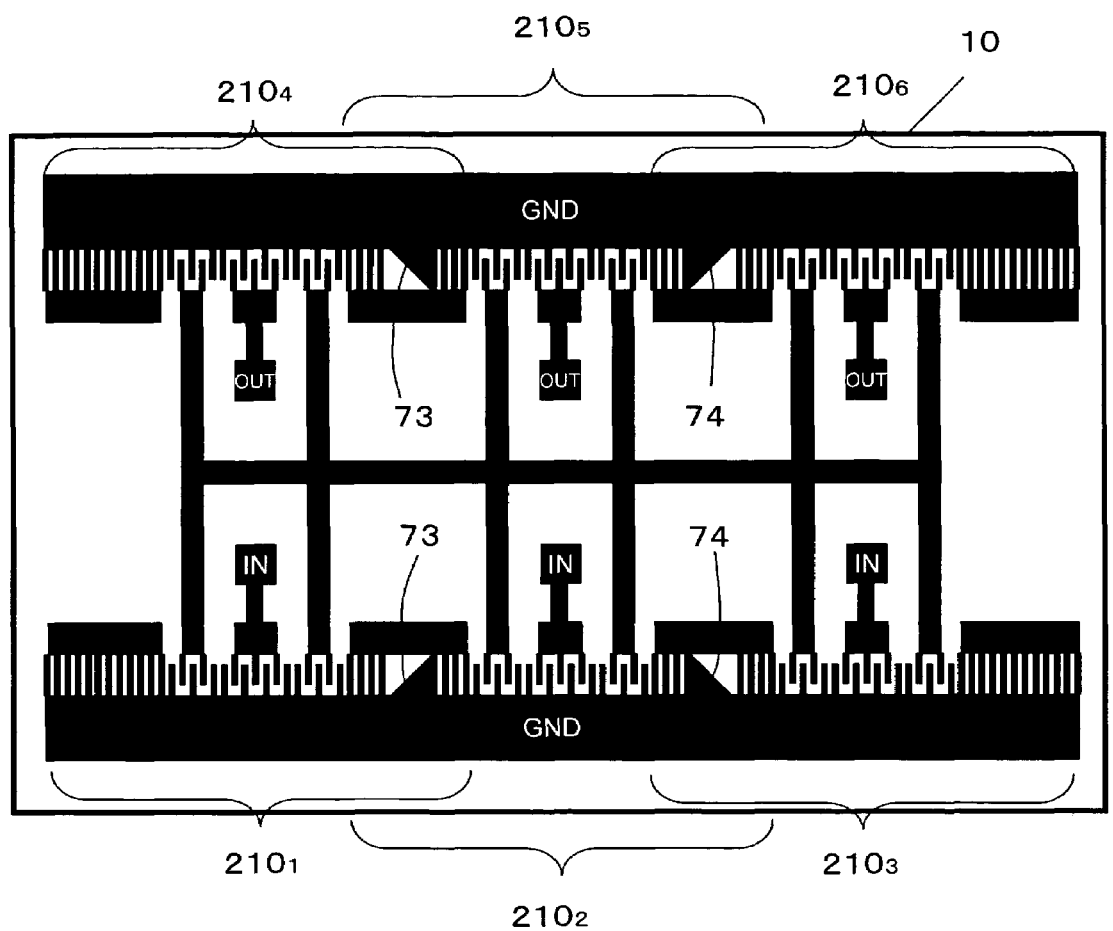
FIG. 26 illustrates a filter structure in accordance with a fifth embodiment of the present invention.

FIG. 26 illustrates a filter structure in accordance with the fifth embodiment. Like the filter structure in accordance with the fourth embodiment, a set of three DMS filters $210_1$, $210_2$, and $210_3$ connected in parallel is cascaded to another set of three DMS filters $210_4$, $210_5$, and $210_6$ connected in parallel. A prism pattern 73 is provided between the DMS filters $210_1$ and $210_2$, and also between the DMS filters $210_4$ and $210_5$. A prism pattern 74 is provided between the DMS filters $210_2$ and $210_3$, and also between the DMS filters $210_5$ and $210_6$. The prism patterns 73 and 74 are not limited to the shape shown in FIG. 26, and may not be triangular, as long as the SAW propagation paths can be bent. Also, two or more prism patterns may be provided between each two neighboring DMS filters. As long as the SAW propagation paths can be bent, the number and the shape of prism patterns to be employed in this embodiment are not particularly restricted. To bend the SAW propagation paths, it is also possible to employ grating electrodes extending in a direction that is not perpendicular to the SAW propagation direction, as shown in FIG. 20.

Figure 27:
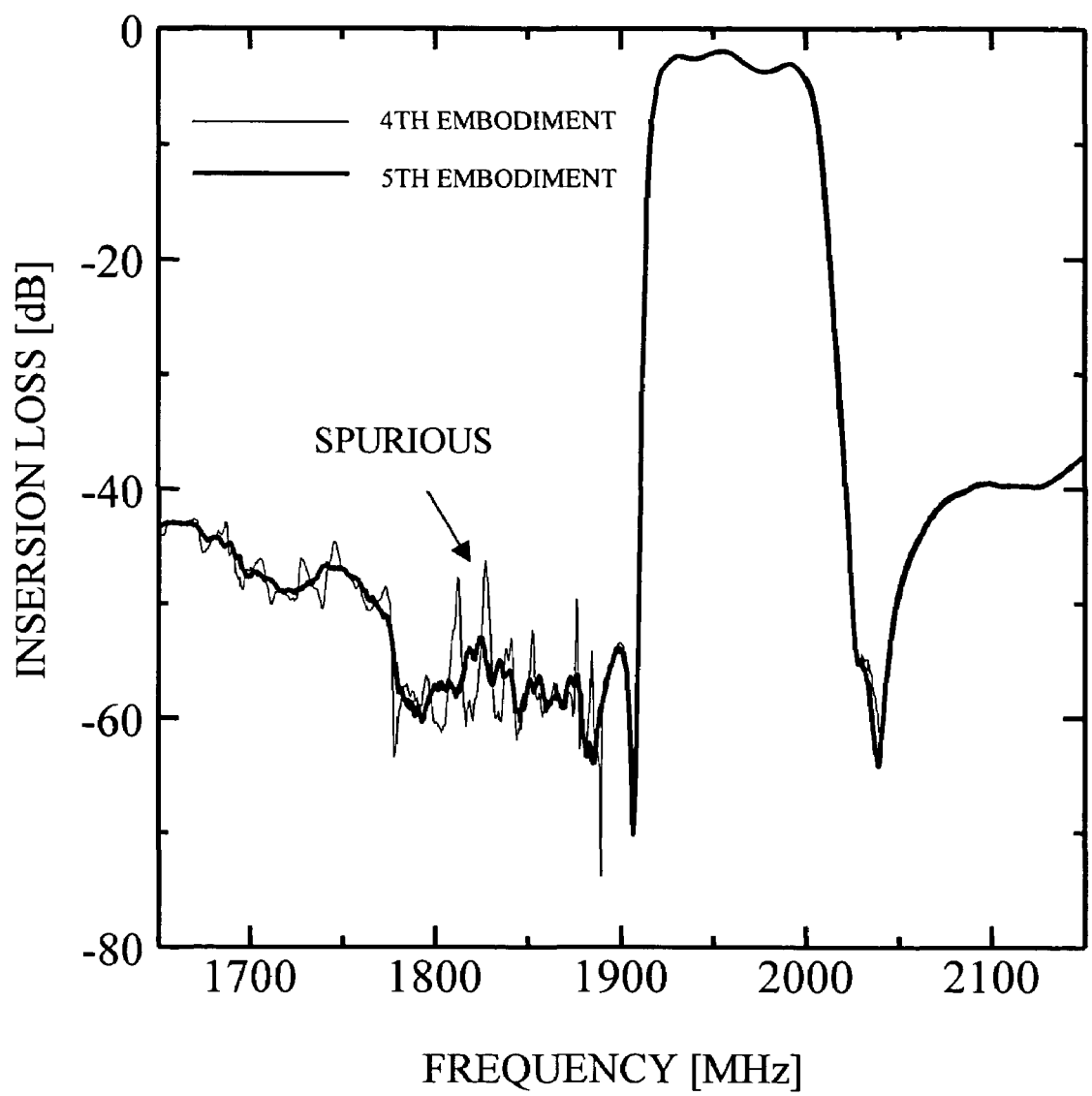
FIG. 27 shows a comparison between the characteristics of the fourth embodiment and the characteristics of the fifth embodiment.

FIG. 27 shows a comparison between the filter characteristics of the SAW filter of the fifth embodiment shown in FIG. 26 and the filter characteristics of the SAW filter of the fourth embodiment shown in FIG. 22. As can be seen from FIG. 27, with a prism pattern being provided between each two neighboring DMS filters, the surface acoustic waves reaching neighboring DMS filters through common reflectors are reduced, and the spurious peaks on the low-frequency side are suppressed. With the prism patterns, the DMS filters that are connected in parallel so as to suppress the spurious peaks do not need to be arranged in such a manner that the SAW propagation paths of the DMS filters differ from one another. Accordingly, the filter size can be reduced. Although FIG. 27 shows the filter characteristics in the 1.9 GHz band, the same effects can be obtained in other frequency bands, such as the 800 MHz band and the 2.4 GHz band.

Sixth Embodiment

A sixth embodiment of the present invention is the same as the fifth embodiment, except that the ground terminals of the first set of DMS filters are connected to the ground terminals of the second set of DMS filters on the piezoelectric substrate 10.

Figure 28:
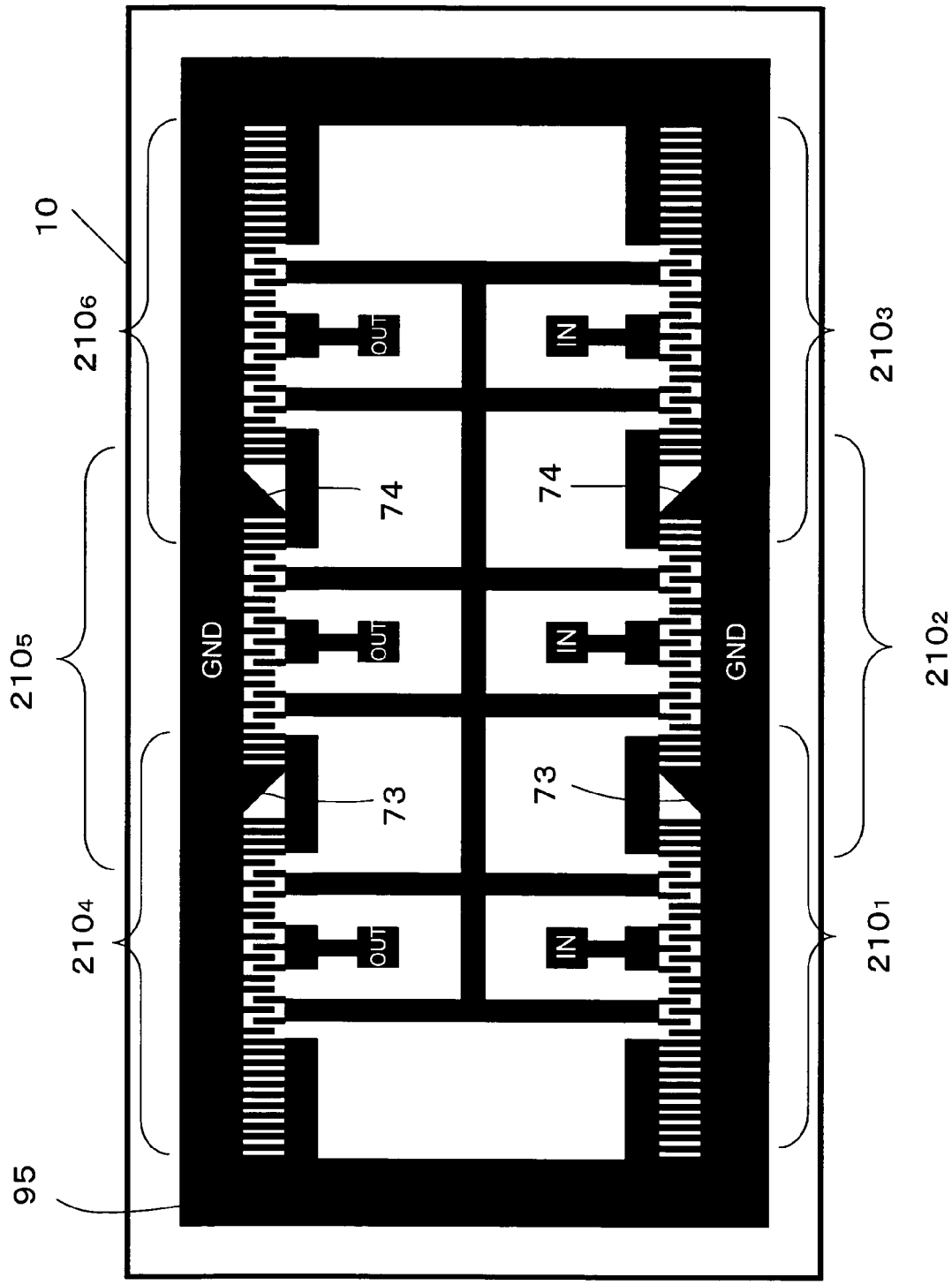
FIG. 28 illustrates a filter structure in accordance with a sixth embodiment of the present invention.
Figure 29:
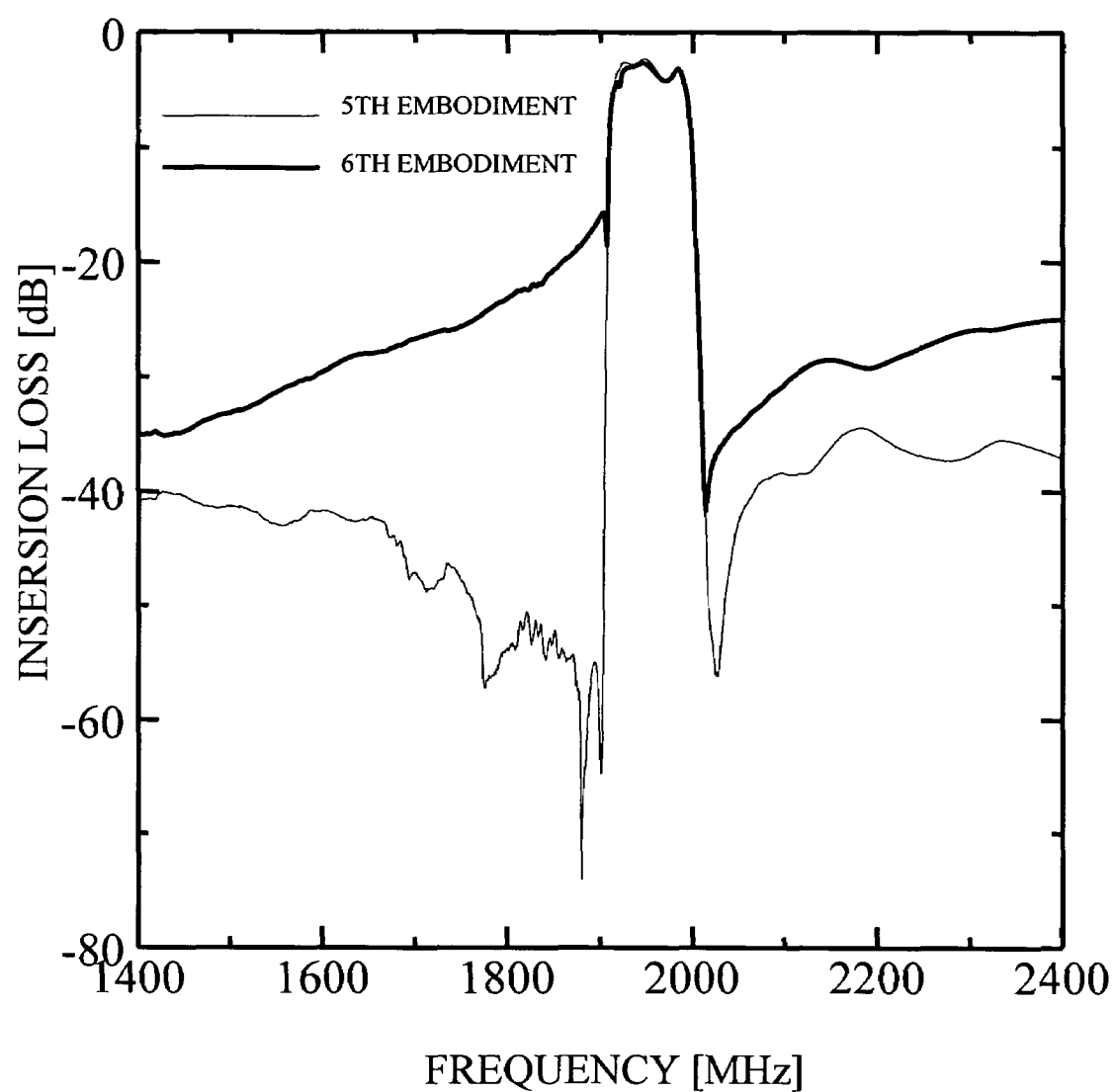
FIG. 29 shows a comparison between the characteristics of the fifth embodiment and the characteristics of the sixth embodiment.

FIG. 28 shows a filter device structure in accordance with the sixth embodiment. In this structure, a common ground pattern 95 is provided to surround all the six DMS filters, so that the entire filter structure can be connected to the ground terminal of a package with only one bonding wire or one bonding bump. Accordingly, this embodiment should realize the simplest packaging process. However, as is apparent from the results (FIG. 29) of a comparison between the filter characteristics of the sixth embodiment and the filter characteristics of the fifth embodiment, the stop-band suppression greatly deteriorates due to the ground terminal connection between the first set and the second set on the piezoelectric substrate 10. The insertion loss in the pass band also increases. Judging from these results, it is more preferable to separate the ground terminals of one set from the ground terminals of the other set on the piezoelectric substrate in a cascaded structure of two or more sets of DMS filters of the present invention. Although FIG. 29 shows the filter characteristics in the 1.9 GHz band, the same filter characteristics can be obtained in other frequency bands, such as the 800 MHz band and the 2.4 GHz band.

Seventh Embodiment

A seventh embodiment of the present invention provides a duplexer in which any of the multi-mode SAW filters of the first to sixth embodiments can be employed.

Figure 30:
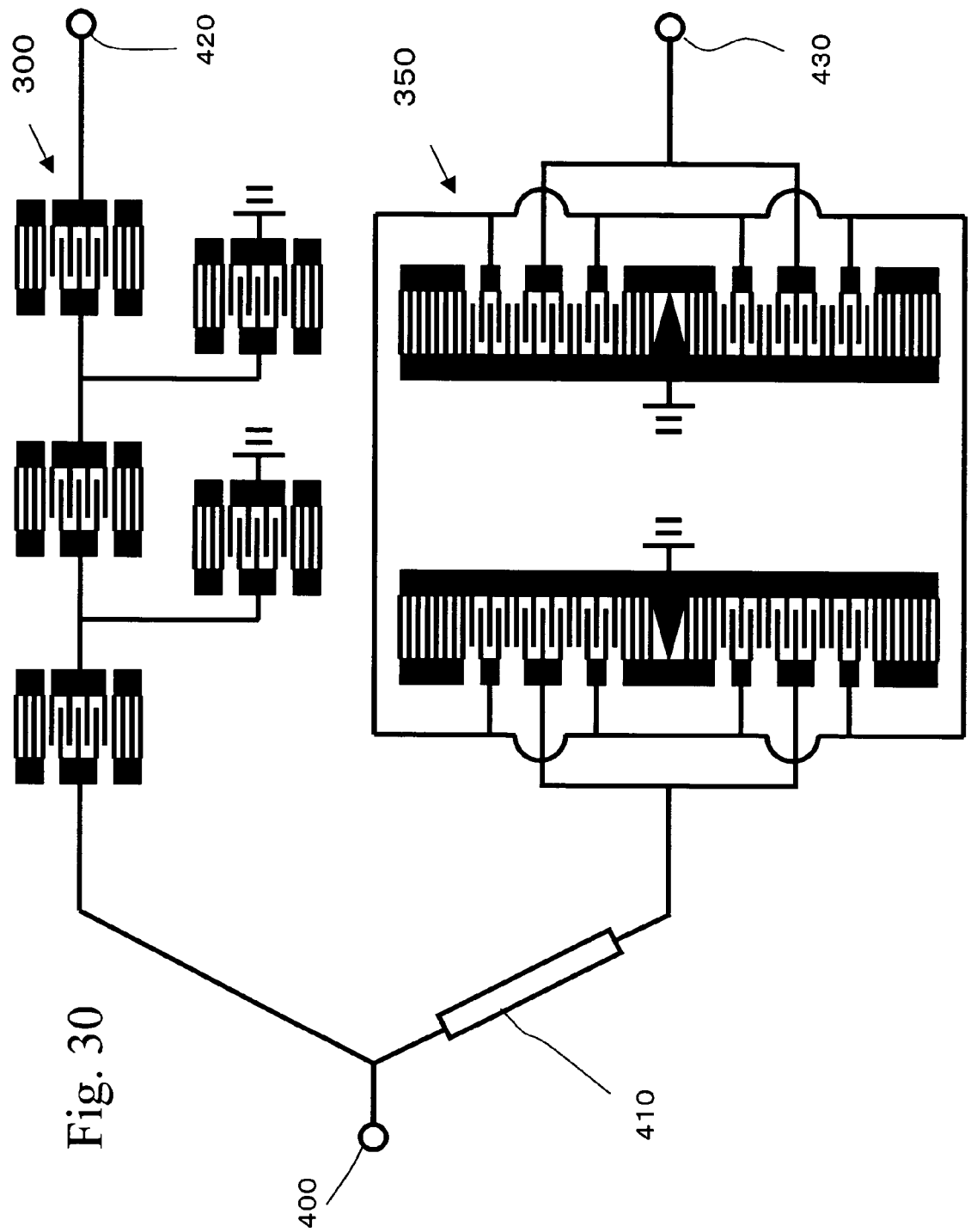
FIG. 30 illustrates a duplexer in accordance with a seventh embodiment of the present invention.

FIG. 30 illustrates a duplexer that includes multi-mode SAW filters of the present invention. In this duplexer, a ladder-type SAW filter 300 is employed as the transmission filter, and a multi-mode SAW filter 350 that has two multi-mode SAW filters cascaded is employed as the reception filter. Each of the two multi-mode SAW filters of the reception filter is the same as the multi-mode SAW filter shown in FIG. 21. However, any one of the other embodiments of the present invention can be used for the reception filter. Although only the reception filter includes multi-mode SAW filters of the present invention, the transmission filter may also include a multi-mode SAW filter of the present invention, or both the transmission filter and the reception filter include one or more multi-mode SAW filters of the present invention. The duplexer shown in FIG. 30 further includes an input terminal 400 that is connected to an antenna, a matching circuit 410 that performs impedance matching between the transmission side and the reception side, a transmission terminal 420 that receives transmission signals, and a reception terminal 430 that outputs reception signals.

With the multi-mode SAW filters of the present invention, the rising and declining regions of the characteristics of the reception filter of the duplexer become steep. Accordingly, transmission signals and reception signals do not adversely affect each other, even if the transmission frequency band is very close to the reception frequency band.

Any one of the SAW filters of the above embodiments and modifications of the present invention can be mounted to a package so as to provide a packaged SAW filter device.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A multi-mode surface acoustic wave filter device comprising:
   a piezoelectric substrate;
   at least one input IDT and at least one output IDT that are formed on the piezoelectric substrate; and
   reflectors that are formed on the piezoelectric substrate and arranged on external sides of the input IDT and the output IDT,
   ground electrode fingers of the input IDT and ground electrode fingers of the output IDT being connected to an identical ground bus bar.

2. A surface acoustic wave duplexer comprising a multi-mode surface acoustic wave filter device as claimed in claim 1, comprising
   a transmission filter and a reception filter
   at least one of the transmission filter and the reception filter being a multi-mode surface acoustic wave filter that comprises:
   a piezoelectric substrate;
   at least one input IDT and at least one output IDT that are formed on the piezoelectric substrate, wherein a total number of said input IDTs and said output IDTs is at least three IDTs, such that the multi-mode surface acoustic wave filter device comprises at least one of a plurality of input IDTs and a plurality of output IDTs, wherein a signal terminal of said plurality of input IDTs are connected to each other or a signal terminal of said plurality of output IDTs are connected to each other;
   reflectors that are formed on the piezoelectric substrate and arranged on external sides of the input IDT and the output IDT;
   an input terminal that supplies input signals to the input IDT; and
   an output terminal that receives output signals from the output IDT, the input terminal and the output terminal extending in an identical direction.

3. A multi-mode surface acoustic wave filter device comprising
   at least two multi-mode surface acoustic wave filters that are electrically connected in parallel,
   each of the at least two multi-mode surface acoustic wave filters comprising:
   a piezoelectric substrate;
   at least one input IDT and at least one output IDT that are formed on the piezoelectric substrate; and
   reflectors that are formed on the piezoelectric substrate and arranged on external sides of the input IDT and the output IDT,
   the at least two multi-mode surface acoustic wave filters connected in parallel being arranged so as to have identical surface acoustic wave propagation paths, and
   grating electrodes being interposed between each two neighboring multi-mode surface acoustic wave filters among the at least two multi-mode surface acoustic wave filters connected in parallel, the grating electrodes being arranged at an angle not perpendicular to propagation directions of surface acoustic waves.

4. A multi-mode surface acoustic wave filter device comprising
   at least two multi-mode surface acoustic wave filters that are electrically connected in parallel,
   each of the at least two multi-mode surface acoustic wave filters comprising:
   a piezoelectric substrate;
   at least one input IDT and at least one output IDT that are formed on the piezoelectric substrate, wherein a total number of said input IDTs and said output IDTs is at least three IDTs, such that the multi-mode surface acoustic wave filter device comprises at least one of a plurality of input IDTs and a plurality of output IDTs;

reflectors that are formed on the piezoelectric substrate and arranged on external sides of the input IDT and the output IDT;

an input terminal that supplies input signals to the input IDT; and an output terminal that receives output signals from the output IDT, the input terminal and the output terminal extending in an identical direction.

5. A multi-mode surface acoustic wave filter device comprising at least two multi-mode surface acoustic wave filters that are electrically connected in parallel, each of the at least two multi-mode surface acoustic wave filters comprising:

a piezoelectric substrate;

at least one input IDT and at least one output IDT that are formed on the piezoelectric substrate;

reflectors that are formed on the piezoelectric substrate and arranged on external sides of the input IDT and the output IDT;

an input terminal that supplies input signals to the input IDT; and an output terminal that receives output signals from the output IDT, the input terminal and the output terminal extending in an identical direction, wherein each of the at least two multi-mode surface acoustic wave filters connected in parallel has a ground terminal of the input IDT and a ground terminal of the output IDT connected to each other on the piezoelectric substrate.

6. A multi-mode surface acoustic wave filter device comprising at least two multi-mode surface acoustic wave filters that are electrically connected in parallel, each of the at least two multi-mode surface acoustic wave filters comprising:

a piezoelectric substrate;

at least one input IDT and at least one output IDT that are formed on the piezoelectric substrate; and reflectors that are formed on the piezoelectric substrate and arranged on external sides of the input IDT and the output IDT, ground electrode fingers of the input IDT and ground electrode fingers of the output IDT being connected to an identical ground bus bar.

7. A multi-mode surface acoustic wave filter device comprising at least two multi-mode surface acoustic wave filters that are electrically connected in parallel, each of the at least two multi-mode surface acoustic wave filters comprising:

a piezoelectric substrate;

at least one input IDT and at least one output IDT that are formed on the piezoelectric substrate;

reflectors that are formed on the piezoelectric substrate and arranged on external sides of the input IDT and the output IDT;

an input terminal that supplies input signals to the input IDT; and an output terminal that receives output signals from the output IDT, the input terminal and the output terminal extending in an identical direction, wherein the at least two multi-mode surface acoustic wave filters connected in parallel have ground terminals connected to each other on the piezoelectric substrate.

8. A multi-mode surface acoustic wave filter device comprising at least two multi-mode surface acoustic wave filters that are electrically connected in parallel, each of the at least two multi-mode surface acoustic wave filters comprising:

a piezoelectric substrate;

at least one input IDT and at least one output IDT that are formed on the piezoelectric substrate;

reflectors that are formed on the piezoelectric substrate and arranged on external sides of the input IDT and the output IDT;

an input terminal that supplies input signals to the input IDT; and an output terminal that receives output signals from the output IDT, the input terminal and the output terminal extending in an identical direction, wherein the at least two multi-mode surface acoustic wave filters connected in parallel have identical pass bands.

9. A multi-mode surface acoustic wave filter device comprising at least two multi-mode surface acoustic wave filters that are electrically connected in parallel, each of the at least two multi-mode surface acoustic wave filters comprising:

a piezoelectric substrate; and at least one input IDT and at least one output IDT that are formed on the piezoelectric substrate, the at least two multi-mode surface acoustic wave filters connected in parallel being arranged so as to have identical surface acoustic wave propagation paths, and a triangular prism pattern being interposed between each two neighboring multi-mode surface acoustic wave filters among the at least two multi-mode surface acoustic wave filters connected in parallel.

10. A multi-mode surface acoustic wave filter device comprising at least two multi-mode surface acoustic wave filters that are electrically connected in parallel, each of the at least two multi-mode surface acoustic wave filters comprising:

a piezoelectric substrate;

at least one input IDT and at least one output IDT that are formed on the piezoelectric substrate; and reflectors that are formed on the piezoelectric substrate and arranged on external sides of the input IDT and the output IDT, the at least two multi-mode surface acoustic wave filters connected in parallel being arranged so as to have identical surface acoustic wave propagation paths, and a common reflector being interposed between the at least two multi-mode surface acoustic wave filters, the common reflector being shared between the at least two multi-mode surface acoustic wave filters.

11. The multi-mode surface acoustic wave filter device as claimed in claim 10, wherein each of the at least two multi-mode surface acoustic wave filters connected in parallel has an input terminal that supplies input signals to the input IDT and an output terminal that receives output signals from the output IDT, the input terminal and the output terminal extending in an identical direction.

12. The multi-mode surface acoustic wave filter device as claimed in claim 11, wherein each of the at least two multi-mode surface acoustic wave filters connected in parallel has a ground terminal of the input IDT and a ground terminal of the output IDT connected to each other on the piezoelectric substrate.

13. The multi-mode surface acoustic wave filter device as claimed in claim 10, wherein each of the at least two multi-mode surface acoustic wave filters has ground electrode fingers of the input IDT and ground electrode fingers of the output IDT connected to an identical ground bus bar.

14. A multi-mode surface acoustic wave filter device comprising
at least two multi-mode surface acoustic wave filters that are electrically connected in parallel,
each of the at least two multi-mode surface acoustic wave filters comprising:
a piezoelectric substrate;
at least one input IDT and at least one output IDT that are formed on the piezoelectric substrate, wherein a total number of said input IDTs and said output IDTs is at least three IDTs, such that the multi-mode surface acoustic wave filter device comprises at least one of a plurality of input IDTs and a plurality of output IDTs, wherein a signal terminal of said plurality of input IDTs are connected to each other or a signal terminal of said plurality of output IDTs are connected to each other; and
reflectors that are formed on the piezoelectric substrate and arranged on external sides of the input IDT and the output IDT,
ground electrode fingers of the input IDT extending in the same direction as ground electrode fingers of the output IDT.

15. The multi-mode surface acoustic wave filter device as claimed in claim 14, wherein the piezoelectric substrate is provided in common to the at least two multi-mode surface acoustic wave filters.

16. A multi-mode surface acoustic wave filter device comprising:
a piezoelectric substrate;
multi-mode surface acoustic wave filters arranged on the piezoelectric substrate so as to have groups that are cascaded, each of the groups including multi-mode surface acoustic wave filters connected in parallel; and
reflectors that are formed on the piezoelectric substrate and arranged on external sides of the input IDT and the output IDT, an input terminal that supplies input signals to the input IDT; and an output terminal that receives output signals from the output IDT, the input terminal and the output terminal extending in an identical direction,
wherein each of the multi-mode surface acoustic wave filters includes at least one input IDT and at least one output IDT that are formed on the piezoelectric substrate, wherein a total number of said input IDTs and said output IDTs is at least three IDTs, such that the multi-mode surface acoustic wave filter device comprises at least one of a plurality of input IDTs and a plurality of output IDTs, wherein a signal terminal of said plurality of input IDTs are connected to each other or a signal terminal of said plurality of output IDTs are connected to each other.

17. The multi-mode surface acoustic wave filter device as claimed in claim 16, wherein ground terminals of one of the groups of multi-mode surface acoustic wave filters are separated from ground terminals of another one of the groups on the piezoelectric substrate.

18. The multi-mode surface acoustic wave filter device as claimed in claim 16, wherein a ground terminal of the input IDT and a ground terminal of the output IDT are connected to each other on the piezoelectric substrate.

19. A multi-mode surface acoustic wave filter device comprising:
a piezoelectric substrate;
multi-mode surface acoustic wave filters arranged on the piezoelectric substrate so as to have groups that are cascaded, each of the groups including multi-mode surface acoustic wave filters connected in parallel; and
reflectors that are formed on the piezoelectric substrate and arranged on external sides of the input IDT and the output IDT, ground electrode fingers of the input IDT extending in the same direction as the ground electrode fingers of the output IDT,
wherein each of the multi-mode surface acoustic wave filters includes at least one input IDT and at least one output IDT that are formed on the piezoelectric substrate, wherein a total number of said input IDTs and said output IDTs is at least three IDTs, such that the mold-mode surface acoustic wave filter device comprises at least one of a plurality of input IDTs and a plurality of output IDTs, wherein a signal terminal of said plurality of input IDTs are connected to each other or a signal terminal of said plurality of output IDTs are connected to each other.

* * * * *